(12) United States Patent
Umezaki

(10) Patent No.: US 10,916,571 B2
(45) Date of Patent: Feb. 9, 2021

(54) SEMICONDUCTOR DEVICE

(71) Applicant: Semiconductor Energy Laboratory Co., Ltd., Atsugi (JP)

(72) Inventor: Atsushi Umezaki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/699,863

(22) Filed: Dec. 2, 2019

(65) Prior Publication Data

US 2020/0105802 A1  Apr. 2, 2020

Related U.S. Application Data

(63) Continuation of application No. 16/417,864, filed on May 21, 2019, now Pat. No. 10,497,723, which is a
(Continued)

(30) Foreign Application Priority Data

Sep. 30, 2011 (JP) ................. 2011-217150

(51) Int. Cl.
*H01L 27/12* (2006.01)
*H01L 29/786* (2006.01)
(Continued)

(52) U.S. Cl.
CPC ........... *H01L 27/1255* (2013.01); *G09G 3/14* (2013.01); *G09G 3/32* (2013.01); *G09G 3/36* (2013.01);
(Continued)

(58) Field of Classification Search
CPC combination set(s) only.
See application file for complete search history.

(56) References Cited

U.S. PATENT DOCUMENTS 4,317,051 A  2/1982 Young
4,633,105 A * 12/1986 Tsujimoto ............... G11C 7/10
326/88
(Continued)

FOREIGN PATENT DOCUMENTS

EP  1770788 A  4/2007
EP  1995787 A  11/2008
(Continued)

OTHER PUBLICATIONS

Fukumoto.E et al., "High Mobility Oxide Semiconductor TFT for Circuit Integration of AM-OLED", IDW '10 : Proceedings of the 16th International Display Workshops, Dec. 1, 2010, pp. 631-634.
(Continued)

*Primary Examiner* — Adam D Houston
(74) *Attorney, Agent, or Firm* — Fish & Richardson P.C.

(57) ABSTRACT

Provided is a semiconductor device exemplified by an inverter circuit and a shift register circuit, which is characterized by a reduced number of transistors. The semiconductor device includes a first transistor, a second transistor, and a capacitor. One of a source and a drain of the first transistor is electrically connected to a first wiring, and the other thereof is electrically connected to a second wiring. One of a source and a drain of the second transistor is electrically connected to the first wiring, a gate of the second transistor is electrically connected to a gate of the first transistor, and the other of the source and the drain of the second transistor is electrically connected to one electrode of the capacitor, while the other electrode of the capacitor is electrically connected to a third wiring. The first and second transistors have the same conductivity type.

10 Claims, 17 Drawing Sheets

Related U.S. Application Data continuation of application No. 15/795,321, filed on Oct. 27, 2017, now Pat. No. 10,304,872, which is a continuation of application No. 15/247,995, filed on Aug. 26, 2016, now Pat. No. 9,806,107, which is a continuation of application No. 14/594,256, filed on Jan. 12, 2015, now Pat. No. 9,432,016, which is a continuation of application No. 14/222,822, filed on Mar. 24, 2014, now Pat. No. 8,941,416, which is a continuation of application No. 13/606,440, filed on Sep. 7, 2012, now Pat. No. 8,736,315.

(51) Int. Cl.

| | | |
|---|---|---|
| *G09G 3/14* | (2006.01) | |
| *H03B 1/00* | (2006.01) | |
| *H03K 3/00* | (2006.01) | |
| *G09G 3/32* | (2016.01) | |
| *G09G 3/36* | (2006.01) | |
| *H03K 17/687* | (2006.01) | |
| *G11C 19/00* | (2006.01) | |

(52) U.S. Cl.
CPC .......... *G11C 19/00* (2013.01); *H01L 29/7869* (2013.01); *H03B 1/00* (2013.01); *H03K 3/00* (2013.01); *H03K 17/6871* (2013.01); *G09G 2300/0426* (2013.01); *G09G 2310/0286* (2013.01); *G09G 2330/021* (2013.01)

(56) References Cited

U.S. PATENT DOCUMENTS

| | | | | |
|---|---|---|---|---|
| 4,644,190 | A * | 2/1987 | Eberhard | H03K 19/01714 326/120 |
| 5,502,406 | A | 3/1996 | Traynor et al. | |
| 5,514,994 | A * | 5/1996 | Sawada | H03K 19/01714 327/390 |
| 5,517,148 | A | 5/1996 | Yin | |
| 5,867,138 | A | 2/1999 | Moon | |
| 6,215,349 | B1 * | 4/2001 | Hanson | G11C 7/1069 327/390 |
| 6,242,973 | B1 * | 6/2001 | Kong | G11C 7/1051 327/390 |
| 6,400,189 | B2 * | 6/2002 | McDaniel | H03K 19/00315 326/83 |
| 6,788,108 | B2 | 9/2004 | Miyake et al. | |
| 6,927,618 | B2 * | 8/2005 | Kimura | H03K 19/00384 327/427 |
| 6,975,142 | B2 | 12/2005 | Azami et al. | |
| 7,038,653 | B2 | 5/2006 | Moon | |
| 7,091,749 | B2 | 8/2006 | Miyake et al. | |
| 7,151,400 | B2 | 12/2006 | Chen | |
| 7,253,665 | B2 | 8/2007 | Kimura | |
| 7,265,581 | B2 | 9/2007 | Yeh | |
| 7,301,533 | B2 | 11/2007 | Shin et al. | |
| 7,362,139 | B2 | 4/2008 | Miyake et al. | |
| 7,432,737 | B2 * | 10/2008 | Yoshida | G09G 3/3677 326/46 |
| 7,436,923 | B2 | 10/2008 | Tobita | |
| 7,468,615 | B1 | 12/2008 | Tan et al. | |
| 7,499,518 | B2 | 3/2009 | Tobita et al. | |
| 7,528,643 | B2 * | 5/2009 | Kimura | H03K 19/01728 327/310 |
| 7,554,379 | B2 | 6/2009 | Pilling et al. | |
| 7,586,478 | B2 | 9/2009 | Azami et al. | |
| 7,602,215 | B2 * | 10/2009 | Osame | G09G 3/3266 326/46 |
| 7,627,076 | B2 | 12/2009 | Tobita | |
| 7,674,650 | B2 | 3/2010 | Akimoto et al. | |
| RE41,215 | E | 4/2010 | Miyake et al. | |
| 7,732,819 | B2 | 6/2010 | Akimoto et al. | |
| 7,738,623 | B2 | 6/2010 | Tobita | |
| 7,772,884 | B2 | 8/2010 | Kwon | |
| 7,786,985 | B2 * | 8/2010 | Kimura | H01L 27/1255 345/204 |
| 7,795,946 | B2 | 9/2010 | Kim | |
| 7,825,888 | B2 | 11/2010 | Tobita et al. | |
| 7,893,732 | B2 | 2/2011 | Tobita | |
| 7,903,079 | B2 | 3/2011 | Azami et al. | |
| 7,910,490 | B2 | 3/2011 | Akimoto et al. | |
| 7,932,521 | B2 | 4/2011 | Akimoto et al. | |
| 7,932,888 | B2 | 4/2011 | Miyake | |
| 7,965,127 | B2 * | 6/2011 | Svensson | H03K 17/284 327/427 |
| 7,969,390 | B2 * | 6/2011 | Yoshida | G09G 3/325 345/76 |
| 8,008,950 | B2 | 8/2011 | Jinta | |
| 8,023,610 | B2 | 9/2011 | Miyayama et al. | |
| 8,040,163 | B2 | 10/2011 | Jinta | |
| 8,067,775 | B2 | 11/2011 | Miyairi et al. | |
| RE43,401 | E | 5/2012 | Miyake et al. | |
| 8,199,871 | B2 | 6/2012 | Liu | |
| 8,207,756 | B2 | 6/2012 | Shionoiri et al. | |
| 8,212,600 | B2 * | 7/2012 | Osame | G11C 19/184 327/218 |
| 8,269,547 | B2 | 9/2012 | Nonaka | |
| 8,274,077 | B2 | 9/2012 | Akimoto et al. | |
| 8,300,039 | B2 | 10/2012 | Yamamoto et al. | |
| 8,314,765 | B2 | 11/2012 | Umezaki | |
| 8,446,177 | B2 | 5/2013 | Yamamoto et al. | |
| 8,466,463 | B2 | 6/2013 | Akimoto et al. | |
| 8,508,459 | B2 | 8/2013 | Miyake | |
| RE44,657 | E | 12/2013 | Miyake et al. | |
| 8,629,069 | B2 | 1/2014 | Akimoto et al. | |
| 8,669,550 | B2 | 3/2014 | Akimoto et al. | |
| 8,681,077 | B2 * | 3/2014 | Kimura | G09G 3/2014 345/77 |
| 8,710,895 | B2 | 4/2014 | Jo | |
| 8,743,044 | B2 * | 6/2014 | Umezaki | G09G 3/2092 345/100 |
| 8,766,901 | B2 | 7/2014 | Miyake | |
| 8,774,347 | B2 | 7/2014 | Umezaki | |
| 8,790,959 | B2 | 7/2014 | Akimoto et al. | |
| 8,796,069 | B2 | 8/2014 | Akimoto et al. | |
| 8,902,144 | B2 | 12/2014 | Umezaki | |
| 8,902,374 | B2 | 12/2014 | Umezaki | |
| 9,001,959 | B2 * | 4/2015 | Koyama | H01L 27/1225 377/64 |
| 9,036,767 | B2 | 5/2015 | Umezaki | |
| 9,064,753 | B2 | 6/2015 | Miyake | |
| 9,099,562 | B2 | 8/2015 | Akimoto et al. | |
| 9,311,876 | B2 | 4/2016 | Umezaki | |
| 9,337,184 | B2 | 5/2016 | Umezaki | |
| 9,543,039 | B2 * | 1/2017 | Amano | G06F 1/3265 |
| 9,583,513 | B2 * | 2/2017 | Umezaki | G09G 3/3266 |
| 9,715,845 | B2 * | 7/2017 | Umezaki | H01L 27/1225 |
| 9,715,860 | B2 * | 7/2017 | Yang | G11C 19/28 |
| 9,755,643 | B2 * | 9/2017 | Inoue | G11C 11/418 |
| 9,767,751 | B2 * | 9/2017 | Dai | G09G 3/3677 |
| 9,830,878 | B2 * | 11/2017 | Koyama | H01L 27/1225 |
| 9,842,861 | B2 * | 12/2017 | Umezaki | H01L 27/1222 |
| 9,858,880 | B2 * | 1/2018 | Dai | G09G 3/3677 |
| 9,865,211 | B2 * | 1/2018 | Cao | G09G 3/3677 |
| 9,941,308 | B2 | 4/2018 | Umezaki | |
| 10,008,519 | B1 | 6/2018 | Umezaki | |
| 10,121,435 | B2 | 11/2018 | Umezaki | |
| 2002/0080651 | A1 | 6/2002 | Tanzawa et al. | |
| 2002/0140458 | A1 | 10/2002 | Sato et al. | |
| 2005/0046445 | A1 * | 3/2005 | Kasuga | G11C 19/28 326/88 |
| 2006/0164376 | A1 | 7/2006 | Moon | |
| 2007/0064469 | A1 | 3/2007 | Umezaki | |
| 2007/0085847 | A1 * | 4/2007 | Shishido | G09G 3/3225 345/204 |
| 2008/0062112 | A1 * | 3/2008 | Umezaki | G02F 1/136213 345/100 |
| 2008/0219401 | A1 * | 9/2008 | Tobita | G11C 19/28 377/79 |
| 2008/0308796 | A1 | 12/2008 | Akimoto et al. | |
| 2008/0308805 | A1 | 12/2008 | Akimoto et al. | |
| 2008/0308806 | A1 | 12/2008 | Akimoto et al. | |

(56) References Cited

U.S. PATENT DOCUMENTS

| | | | |
|---|---|---|---|
| 2009/0008639 A1 | 1/2009 | Akimoto et al. | |
| 2009/0224245 A1* | 9/2009 | Umezaki | G02F 1/136286 |
| | | | 257/59 |
| 2009/0305461 A1 | 12/2009 | Akimoto et al. | |
| 2010/0110623 A1 | 5/2010 | Koyama et al. | |
| 2010/0133533 A1 | 6/2010 | Umezaki | |
| 2010/0136743 A1 | 6/2010 | Akimoto et al. | |
| 2010/0188385 A1* | 7/2010 | Boiko | G11C 19/184 |
| | | | 345/211 |
| 2010/0237911 A1* | 9/2010 | Svensson | H03K 17/284 |
| | | | 327/109 |
| 2010/0252826 A1 | 10/2010 | Yamazaki et al. | |
| 2010/0253393 A1* | 10/2010 | Yamamoto | H03K 19/018507 |
| | | | 327/108 |
| 2010/0271111 A1* | 10/2010 | Jinta | H03K 19/017 |
| | | | 327/530 |
| 2011/0057918 A1 | 3/2011 | Kimura et al. | |
| 2011/0084960 A1 | 4/2011 | Miyake et al. | |
| 2011/0089417 A1 | 4/2011 | Yamazaki et al. | |
| 2011/0089975 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0122988 A1 | 5/2011 | Miyayama et al. | |
| 2011/0140108 A1 | 6/2011 | Kimura et al. | |
| 2011/0148497 A1 | 6/2011 | Ishii | |
| 2011/0149189 A1 | 6/2011 | Azami et al. | |
| 2011/0156024 A1 | 6/2011 | Koyama et al. | |
| 2011/0163311 A1 | 7/2011 | Akimoto et al. | |
| 2011/0176357 A1 | 7/2011 | Koyama et al. | |
| 2011/0193182 A1 | 8/2011 | Takemura | |
| 2011/0199365 A1 | 8/2011 | Umezaki et al. | |
| 2011/0215787 A1 | 9/2011 | Shionoiri et al. | |
| 2011/0227066 A1 | 9/2011 | Umezaki | |
| 2011/0260158 A1* | 10/2011 | Takemura | H01L 27/105 |
| | | | 257/43 |
| 2011/0273407 A1* | 11/2011 | Chung | G09G 3/3266 |
| | | | 345/204 |
| 2011/0278564 A1 | 11/2011 | Yoneda | |
| 2011/0285442 A1 | 11/2011 | Saito | |
| 2012/0051117 A1 | 3/2012 | Yamazaki et al. | |
| 2012/0061668 A1 | 3/2012 | Miyairi et al. | |
| 2012/0063206 A1 | 3/2012 | Furutani et al. | |
| 2012/0099360 A1 | 4/2012 | Takemura | |
| 2012/0140550 A1 | 6/2012 | Endo et al. | |
| 2012/0182788 A1 | 7/2012 | Kurokawa | |
| 2013/0082760 A1* | 4/2013 | Umezaki | H01L 29/7869 |
| | | | 327/404 |
| 2013/0093025 A1* | 4/2013 | Miyake | G09G 3/3677 |
| | | | 257/390 |
| 2013/0140617 A1 | 6/2013 | Umezaki | |
| 2013/0147524 A1* | 6/2013 | Hachida | H03K 3/356026 |
| | | | 327/108 |
| 2013/0154909 A1* | 6/2013 | Jinta | H03K 3/012 |
| | | | 345/80 |
| 2013/0162305 A1* | 6/2013 | Watanabe | G09G 3/3266 |
| | | | 327/109 |
| 2013/0169319 A1* | 7/2013 | Sasaki | G09G 3/3677 |
| | | | 327/108 |
| 2013/0181223 A1* | 7/2013 | Kimura | H03K 19/01728 |
| | | | 257/71 |
| 2013/0234760 A1* | 9/2013 | Wang | G11C 7/1057 |
| | | | 327/108 |
| 2013/0249872 A1* | 9/2013 | Kang | G09G 3/3685 |
| | | | 345/204 |
| 2013/0249884 A1* | 9/2013 | Kim | G09G 3/3677 |
| | | | 345/212 |
| 2013/0314139 A1* | 11/2013 | Umezaki | G02F 1/13624 |
| | | | 327/208 |
| 2014/0042496 A1* | 2/2014 | Ohmaru | H03K 19/17764 |
| | | | 257/202 |
| 2014/0043066 A1* | 2/2014 | Yoon | G11C 19/28 |
| | | | 327/108 |
| 2014/0086379 A1* | 3/2014 | Ma | H03K 5/00 |
| | | | 377/64 |
| 2014/0203855 A1* | 7/2014 | Kim | H03K 5/12 |
| | | | 327/170 |
| 2014/0204009 A1* | 7/2014 | Kim | G09G 3/3677 |
| | | | 345/92 |
| 2014/0264518 A1* | 9/2014 | Matsuzaki | H01L 27/1225 |
| | | | 257/296 |
| 2015/0256157 A1* | 9/2015 | Kozuma | H03K 3/012 |
| | | | 327/333 |
| 2015/0340513 A1 | 11/2015 | Akimoto et al. | |
| 2016/0027815 A1* | 1/2016 | Yamazaki | H01L 51/5259 |
| | | | 257/71 |
| 2017/0062483 A1* | 3/2017 | Kimura | G09G 3/3233 |
| 2017/0125122 A1* | 5/2017 | Miyake | H01L 29/7869 |
| 2017/0125440 A1* | 5/2017 | Kozuma | H01L 27/11807 |
| 2017/0250309 A1* | 8/2017 | Kimura | G09G 3/3233 |
| 2017/0301376 A1* | 10/2017 | Kurokawa | G06N 3/0454 |
| 2017/0309345 A1* | 10/2017 | Umezaki | G11C 19/184 |
| 2018/0047758 A1* | 2/2018 | Kaneyasu | G09G 3/3233 |
| 2018/0053794 A1* | 2/2018 | Umezaki | H03K 3/00 |
| 2018/0061350 A1* | 3/2018 | Sung | G09G 3/3696 |
| 2018/0114799 A1* | 4/2018 | Miyake | H01L 27/1255 |
| 2018/0151593 A1* | 5/2018 | Inoue | G09G 3/3233 |
| 2019/0206354 A1 | 7/2019 | Umezaki | |

FOREIGN PATENT DOCUMENTS

| | | |
|---|---|---|
| EP | 1998373 A | 12/2008 |
| EP | 1998374 A | 12/2008 |
| EP | 1998375 A | 12/2008 |
| GB | 2099651 | 12/1982 |
| JP | 57-196627 A | 12/1982 |
| JP | 59-016424 A | 1/1984 |
| JP | 60-140924 A | 7/1985 |
| JP | 08-083486 A | 3/1996 |
| JP | 2002-328643 A | 11/2002 |
| JP | 2003-179479 A | 6/2003 |
| JP | 2004-064528 A | 2/2004 |
| JP | 2004-103226 A | 4/2004 |
| JP | 2004-260788 A | 9/2004 |
| JP | 2005-123865 A | 5/2005 |
| JP | 2007-123861 A | 5/2007 |
| JP | 2007-179660 A | 7/2007 |
| JP | 2008-122939 A | 5/2008 |
| JP | 2009-077208 A | 4/2009 |
| JP | 2009-188867 A | 8/2009 |
| JP | 2009-219081 A | 9/2009 |
| JP | 2010-152347 A | 7/2010 |
| JP | 2011-055235 A | 3/2011 |
| JP | 2011-101209 A | 5/2011 |
| JP | 2011-229129 A | 11/2011 |
| KR | 2007-0070087 A | 7/2007 |
| KR | 2007-0087506 A | 8/2007 |
| KR | 2007-0087520 A | 8/2007 |
| KR | 2008-0031114 A | 4/2008 |
| KR | 2008-0074026 A | 8/2008 |
| KR | 2008-0081822 A | 9/2008 |
| TW | 200605509 | 2/2006 |
| TW | 200627768 | 8/2006 |
| TW | 201014178 | 4/2010 |
| TW | 201120909 | 6/2011 |
| WO | WO-2010/061723 | 6/2010 |

OTHER PUBLICATIONS

Taiwanese Office Action (Application No. 101135569) dated Jan. 29, 2016.

Korean Office Action (Application No. 2012-0107008) dated Oct. 22, 2018.

* cited by examiner

Prior Art

SEMICONDUCTOR DEVICE

CROSS-REFERENCE TO RELATED APPLICATIONS

This application is a continuation of U.S. application Ser. No. 16/417,864, filed May 21, 2019, now allowed, which is a continuation of U.S. application Ser. No. 15/795,321, filed Oct. 27, 2017, now U.S. Pat. No. 10,304,872, which is a continuation of U.S. application Ser. No. 15/247,995, filed Aug. 26, 2016, now U.S. Pat. No. 9,806,107, which is a continuation of U.S. application Ser. No. 14/594,256, filed Jan. 12, 2015, now U.S. Pat. No. 9,432,016, which is a continuation of U.S. application Ser. No. 14/222,822, filed Mar. 24, 2014, now U.S. Pat. No. 8,941,416, which is a continuation of U.S. application Ser. No. 13/606,440, filed Sep. 7, 2012, now U.S. Pat. No. 8,736,315, which claims the benefit of a foreign priority application filed in Japan as Serial No. 2011-217150 on Sep. 30, 2011, all of which are incorporated by reference.

BACKGROUND OF THE INVENTION

1. Field of the Invention

One embodiment of the present invention relates to semiconductor devices and display devices.

2. Description of the Related Art

The increase in size of display devices such as liquid crystal display devices and EL display devices promotes the development of display devices with higher added value. In particular, techniques by which a driver circuit in a display device is composed of only transistors having the same conductivity type have been actively developed (see Patent Document 1 and Non-Patent Document 1).

FIG. 17A illustrates a driver circuit disclosed in Patent Document 1. The driver circuit disclosed in Patent Document 1 is composed of transistors M1, M2, M3, and M4. When a signal IN is at high level, the transistor M1 is turned off and the transistors M2 to M4 are turned on. Thus, a signal OUT exists in high level. On the other hand, when the signal IN is at low level, the transistor M1 is turned on, the transistors M2 and M4 are turned off, and the transistor M3 is temporarily turned on and then turned off. Thus, the signal OUT is at low level.

FIG. 17B illustrates a driver circuit disclosed in Non-Patent Document 1. The driver circuit disclosed in Non-Patent Document 1 is composed of transistors M11 to M19 and a capacitor C11. When a signal IN is at high level, the transistors M12, M14, M16, and M17 are turned on; the transistors M11, M13, and M15 are turned off; and the transistors M18 and M19 are temporarily turned on and then turned off. Thus, a signal OUT becomes low. On the other hand, when the signal IN is at low level, the transistors M12, M14, M16, M17, and M18 are turned off; the transistors M11, M15, and M19 are turned on; and the transistor M13 is temporarily turned on and then turned off. Thus, the signal OUT is set at high level.

REFERENCE

Patent Document 1: Japanese Published Patent Application No. 2002-328643
Non-Patent Document 1: Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED," IDW'10, pp. 631-634

SUMMARY OF THE INVENTION

In the driver circuit disclosed in Patent Document 1, both the transistors M3 and M4 are turned on when the signal IN is at high level. For that reason, a current flows to a wiring supplied with a potential VSS via the transistors M3 and M4 in this order from a wiring supplied with a potential VDD in a period during which the signal IN is at high level, whereby power consumption is increased.

In addition, in the driver circuit disclosed in Patent Document 1, the potential of a gate of the transistor M1 needs to be low enough to turn off the transistor M1 in a period during which the signal IN is at high level. Consequently, the ratio of channel width (W) to channel length (L) (hereinafter referred to as "W/L") of the transistor M4 needs to be sufficiently larger than that of the transistor M3. However, it is not always easy to increase W/L of the transistor M3 because increase in W/L of the transistor M3 simultaneously requires increase in W/L of the transistor M4, leading to magnify the layout area. For that reason, when the transistor M3 is turned on and the potential VDD is supplied to the gate of the transistor M1 in a period during which the signal IN is at high level, it takes a long time for the potential of the gate of the transistor M1 to reach a predetermined potential. Accordingly, the timing of turning on the transistor M1 is delayed and Vgs of the transistor M1 is decreased, so that the rise time of the signal OUT is extended. As a result, delay, distortion, or the like of the signal OUT occurs.

As is clear from comparison with the driver circuit disclosed in Patent Document 1, the driver circuit disclosed in Non-Patent Document 1 requires a large number of elements including transistors and capacitors.

In view of the above technical background, an object of one embodiment of the present invention is to reduce a current flowing between wirings of a circuit via a transistor to reduce power consumption thereof. Another object is to shorten the rise time of an output signal from a circuit to reduce delay or distortion of the output signal. Another object is to reduce the number of elements such as transistors and capacitors in a circuit. Still another object is to provide a novel circuit configuration. Note that an object and an effect are inseparable, and it is apparent that an effect described in this specification and the like is accompanied by an object associated with the effect. On the other hand, it is apparent that an object described in this specification and the like is accompanied by an effect associated with the object.

According to one embodiment of the present invention, a semiconductor device includes: a first transistor having a source and a drain one of which is electrically connected to a first wiring and the other of which is electrically connected to a second wiring; a second transistor having a source and a drain one of which is electrically connected to the first wiring, and a gate electrically connected to a gate of the first transistor; and a capacitor having a pair of electrodes one of which is electrically connected to a third wiring and the other of which is electrically connected to the other of the source and the drain of the second transistor.

In the embodiment of the present invention, W/L (W: channel width, L: channel length) of the first transistor may be higher than that of the second transistor.

In the embodiment of the present invention, the first transistor and the second transistor may have the same conductivity type.

According to one embodiment of the present invention, a current flowing between wirings of a circuit via a transistor can be reduced, which results in reduction in power consumption thereof. In addition, the rise time of an output signal from a circuit can be shortened, so that delay or distortion of the output signal can be reduced. Moreover, the number of elements such as transistors and capacitors can be reduced in a circuit.

DETAILED DESCRIPTION OF THE INVENTION

Examples of embodiments of the present invention will be described below with reference to the accompanying drawings. Note that it will be readily appreciated by those skilled in the art that details of the embodiments can be modified in various ways without departing from the spirit and scope of the present invention. The present invention is therefore not limited to the following description of the embodiments.

Embodiment 1

In Embodiment 1, an inverter circuit (also referred to as "semiconductor device" or "driver circuit") according to one embodiment of the present invention will be described.

The configuration of an inverter circuit in this embodiment will be described with reference to FIG. 1A.

Figure 1A:
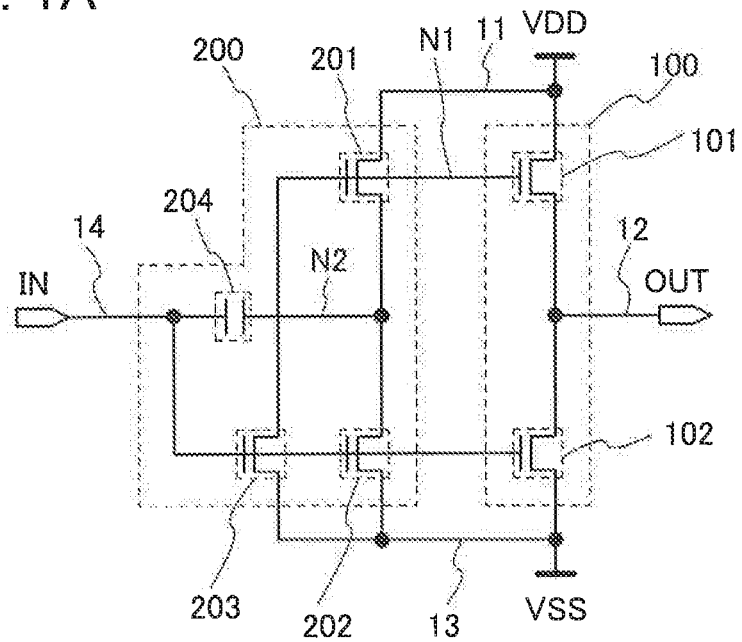
FIGS. 1A and 1B are diagrams for explaining an inverter circuit according to one embodiment of the present invention.

The inverter circuit illustrated in FIG. 1A includes a circuit 100 and a circuit 200. The circuit 100 is connected to a wiring 11, a wiring 12, a wiring 13, a wiring 14, and the circuit 200. The circuit 200 is connected to the wiring 11, the wiring 13, the wiring 14, and the circuit 100.

The circuit 100 includes a transistor 101 and a transistor 102. A first terminal (also referred to as "one of a source and a drain") of the transistor 101 is connected to the wiring 11. A second terminal (also referred to as "the other of the source and the drain") of the transistor 101 is connected to the wiring 12. A first terminal of the transistor 102 is connected to the wiring 13. A second terminal of the transistor 102 is connected to the wiring 12. A gate of the transistor 102 is connected to the wiring 14.

The circuit 200 includes a transistor 201, a transistor 202, a transistor 203, and a capacitor 204. A first terminal of the transistor 201 is connected to the wiring 11. A gate of the transistor 201 is connected to a gate of the transistor 101. A first terminal of the transistor 202 is connected to the wiring 13. A second terminal of the transistor 202 is connected to a second terminal of the transistor 201. A gate of the transistor 202 is connected to the wiring 14. A first terminal of the transistor 203 is connected to the wiring 13. A second terminal of the transistor 203 is connected to the gate of the transistor 201. A gate of the transistor 203 is connected to the wiring 14. A first electrode (also referred to as "one electrode") of the capacitor 204 is connected to the wiring 14. A second electrode (also referred to as "the other electrode") of the capacitor 204 is connected to the second terminal of the transistor 201.

Note that a node N1 denotes a point where the gate of the transistor 101, the gate of the transistor 201, and the second terminal of the transistor 203 are connected to each other. A node N2 denotes a point where the second terminal of the transistor 201, the second terminal of the transistor 202, and the second electrode of the capacitor 204 are connected to each other.

Note that the transistors included in the inverter circuit in this embodiment preferably have the same conductivity type. For example, in the inverter circuit illustrated in FIG. 1A, the transistors 101, 102, and 201 to 203 preferably have the same conductivity type. In this embodiment, the case where the transistors 101, 102, and 201 to 203 are n-channel transistors is described.

Note that in this specification and the like, the term "connection" means electrical connection and corresponds to a state in which current, voltage, a potential, a signal, charge, or the like can be supplied or transmitted. The state of being "connected" therefore means not only a state of direct connection but also a state of indirect connection through an element such as a wiring, a conductive film, a resistor, a diode, a transistor, or a switching element, for example.

The wiring 11 (also referred to as "power supply line") is supplied with a potential VDD and has a function of transmitting the potential VDD. The potential VDD is a constant potential.

The wiring 13 (also referred to as "power supply line") is supplied with a potential VSS and has a function of transmitting the potential VSS. The potential VSS is a constant potential and lower than the potential VDD.

The wiring 14 (also referred to as "signal line") is supplied with a signal IN and has a function of transmitting the signal IN. The signal IN is an input signal of the inverter circuit illustrated in FIG. 1A. The signal IN is a signal for controlling the on/off state of the transistor 102, the transistor 202, and the transistor 203.

The wiring 12 (also referred to as "signal line") outputs a signal OUT and has a function of transmitting the signal OUT. The signal OUT is an output signal of the inverter circuit illustrated in FIG. 1A.

Without limitation to the above signals and potentials, various other signals and potentials can be input to the wirings 11, 13, and 14.

The circuit 100 (also referred to as "buffer circuit") has a function of supplying the potential VDD of the wiring 11 to the wiring 12 in accordance with an output signal of the circuit 200, and a function of supplying the potential VSS of the wiring 13 to the wiring 12 in accordance with the signal IN. That is, the circuit 100 has a function of supplying one of the potential VDD of the wiring 11 and the potential VSS of the wiring 13 to the wiring 12 in accordance with the output signal of the circuit 200 and the signal IN.

The circuit 200 (also referred to as "control circuit") has a function of generating a signal (the potential of the node N1) for controlling the time at which the circuit 100 supplies the potential VDD of the wiring 11 to the wiring 12, in accordance with the signal IN.

The transistor 101 has a function of controlling electrical continuity between the wiring 11 and the wiring 12, a function of supplying the potential VDD of the wiring 11 to the wiring 12, and a function of holding a potential difference between the wiring 12 and the node N1.

The transistor 102 has a function of controlling electrical continuity between the wiring 13 and the wiring 12, and a function of supplying the potential VSS of the wiring 13 to the wiring 12.

The transistor 201 has a function of controlling electrical continuity between the wiring 11 and the node N2, a function of supplying the potential VDD of the wiring 11 to the node N2, and a function of holding a potential difference between the node N1 and the node N2.

The transistor 202 has a function of controlling electrical continuity between the wiring 13 and the node N2, and a function of supplying the potential VSS of the wiring 13 to the node N2.

The transistor 203 has a function of controlling electrical continuity between the wiring 13 and the node N1, and a function of supplying the potential VSS of the wiring 13 to the node N1.

The capacitor 204 has a function of holding a potential difference between the wiring 14 and the node N2.

Figure 1B:
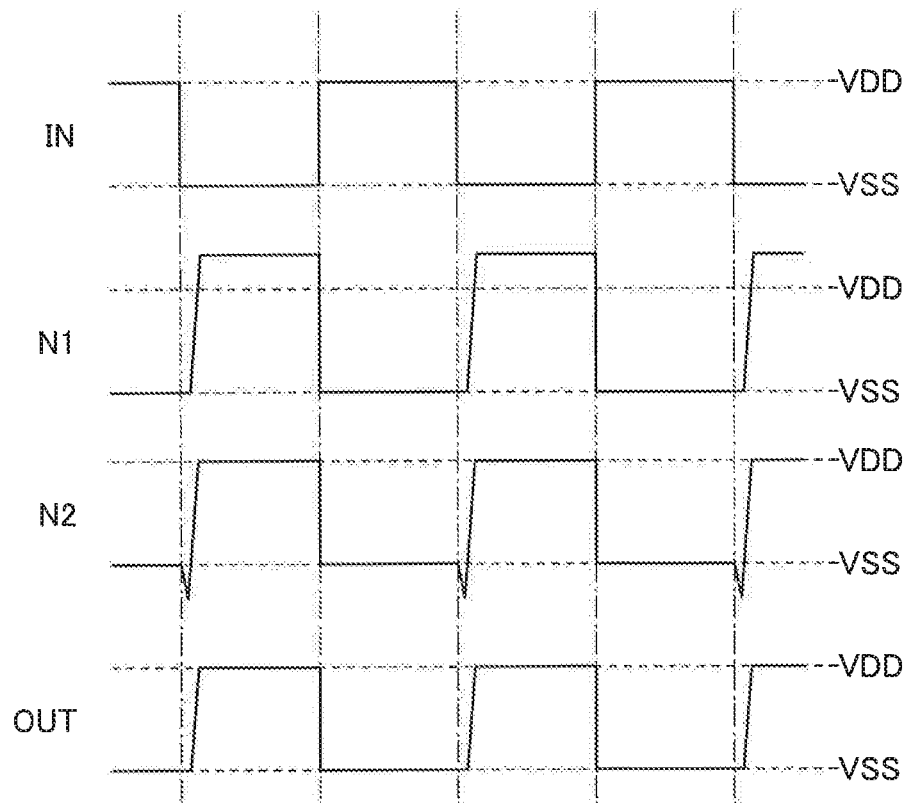

Next, an example of a method of driving the inverter circuit illustrated in FIG. 1A will be described with reference to FIG. 1B. FIG. 1B is an example of a timing chart illustrating the method of driving the inverter circuit in FIG. 1A.

The following description is made assuming that the signal IN is a digital signal with a high-level potential equal to the potential VDD and a low-level potential equal to the potential VSS. The case where the signal IN is at high level and the case where the signal IN is at low level are separately described.

First, when the signal IN is set at high level, the transistors 102, 202, and 203 are turned on.

When the transistor 203 is turned on, the potential VSS of the wiring 13 is supplied to the node N1, so that the potential of the node N1 decreases to the potential VSS. When the potential of the node N1 decreases to the potential VSS, the transistors 101 and 201 are turned off.

When the transistor 202 is turned on, the potential VSS of the wiring 13 is supplied to the node N2. Thus, the potential of the node N2 decreases to the potential VSS.

When the transistor 102 is turned on, the potential VSS of the wiring 13 is supplied to the wiring 12. Thus, the potential of the wiring 12 decreases to the potential VSS. That is, the signal OUT is changed to low level.

Then, when the signal IN is set at low level, the transistors 102, 202, and 203 are turned off.

When the transistor 203 is turned off, the node N1 is brought into a floating state. Consequently, the potential of the node N1 remains at the potential VSS, so that the transistors 101 and 201 are kept off.

When the transistor 202 is turned off, the node N2 is brought into a floating state. At this time, the potential difference between the wiring 14 and the node N2 in the period during which the signal IN is at high level is held in the capacitor 204. Thus, the potential of the node N2 decreases when the signal IN is set at low level. The transistor 201 is turned on when the potential of the node N2 decreases to less than a potential obtained by subtracting the threshold voltage of the transistor 201 from the potential of the node N1 (e.g., the potential VSS).

When the transistor 201 is turned on, the potential VDD of the wiring 11 is supplied to the node N2, so that the potential of the node N2 rises. At this time, the potential difference between the node N1 and the node N2 at the time when the transistor 202 is off is held between the gate and the second terminal of the transistor 201. Consequently, the potential of the node N1 also rises along with the increase in the potential of the node N2. The potential of the node N2 rises to the potential VDD, and the potential of the node N1 exceeds the potential VDD. This is called bootstrap. Then, the transistor 101 is turned on by the increase in the potential of the node N1.

When the transistor 101 is turned on, the potential VDD of the wiring 11 is supplied to the wiring 12. Moreover, the potential of the node N1 exceeds the potential VDD as has been described. Consequently, the potential of the wiring 12 increases to the potential VDD. That is, the signal OUT becomes high.

As described above, the inverter circuit in FIG. 1A does not have a period during which both the transistors 101 and 102 are on or a period during which both the transistors 201 and 202 are on, thereby eliminating a path through which current flows between the wirings 11 and 13. Further, the high-level potential of the signal OUT can be increased to the potential VDD of the wiring 11 with a smaller number of transistors than a conventional driver circuit.

When the signal IN is set at low level, the potential of the node N1 rises along with the increase in the potential of the second terminal of the transistor 101 as well as the increase in the potential of the second terminal of the transistor 201. As a result, the time required for the potential of the node N1 to reach a predetermined potential can be shortened, so that the timing of turning on the transistor 101 can be advanced. Moreover, since the potential of the node N1 can be made higher, Vgs of the transistor 101 can be further increased. The rise time of the signal OUT can be significantly shortened with a synergistic interaction of the ability of the inverter circuit in FIG. 1A to advance timing for turning on the transistor 101 and the ability to increase Vgs of the transistor 101.

Next, inverter circuits different from the one in FIG. 1A will be described with reference to FIGS. 2A and 2B, FIGS. 3A and 3B, FIGS. 4A to 4F, FIGS. 5A and 5B, and FIGS. 6A and 6B.

Figure 2A:
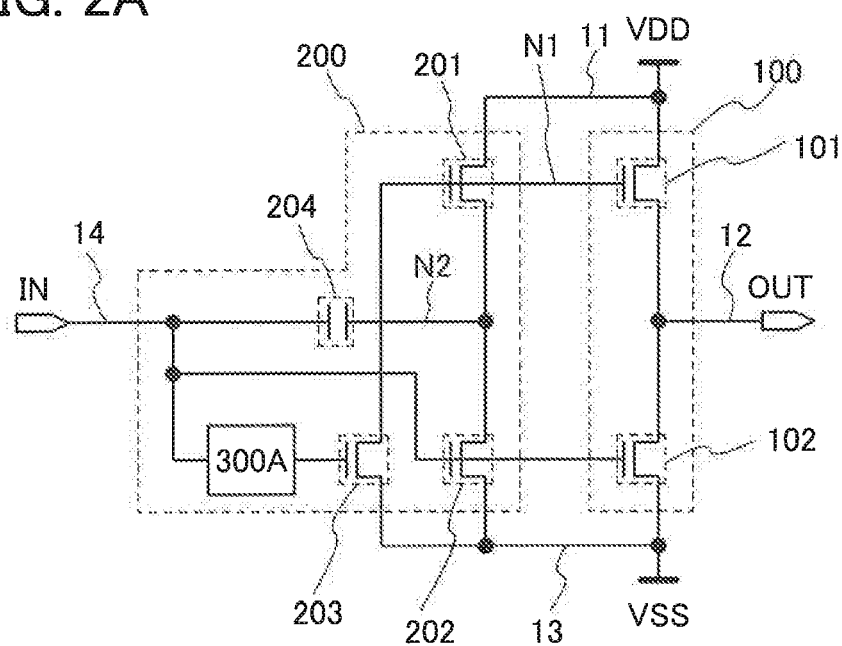
FIGS. 2A and 2B each illustrate an inverter circuit according to one embodiment of the present invention.

The inverter circuit illustrated in FIG. 2A has a configuration in which a circuit 300A is provided in the inverter circuit in FIG. 1A.

A first terminal (also referred to as "input terminal") of the circuit 300A is connected to the wiring 14. A second terminal (also referred to as "output terminal") of the circuit 300A is connected to the gate of the transistor 203.

The circuit 300A has a function of outputting, from the second terminal, a signal corresponding to a signal input to the first terminal (e.g., the signal IN) and a function of outputting, from the second terminal, a signal that is delayed and/or distorted compared to the signal input to the first terminal.

Note that for example, the expression "a second signal is delayed compared to a first signal" means that the timing of rising or falling of the second signal is later than that of the first signal. Further, for example, the expression "the second signal is distorted compared to the first signal" means that the rise time or fall time of the second signal is longer than that of the first signal.

In the inverter circuit in FIG. 2A, the signal output from the second terminal of the circuit 300A remains at high level for a predetermined period after the signal IN changes from high level to low level. In other words, the transistor 203 is kept on and the potential VSS continues to be supplied to the node N1 for a predetermined period after the signal IN changes from high level to low level.

Accordingly, in the inverter circuit in FIG. 2A, the potential VSS of the wiring 13 can be supplied to the node N1 when the potential of the node N2 is decreased by capacitive coupling caused by the capacitor 204, thereby suppressing the decrease in the potential of the node N1 along with the decrease in the potential of the node N2. That is, the potential difference between the node N1 and the node N2 can be increased so that the potential of the node N1 at the time when the potential of the node N2 becomes the potential VDD can be made higher and Vgs of the transistor 101 can be further increased. Consequently, the rise time of the signal OUT can be shortened.

Note that in the inverter circuit in FIG. 2A, the first electrode of the capacitor 204 may be connected to the second terminal of the circuit 300A.

Figure 2B:
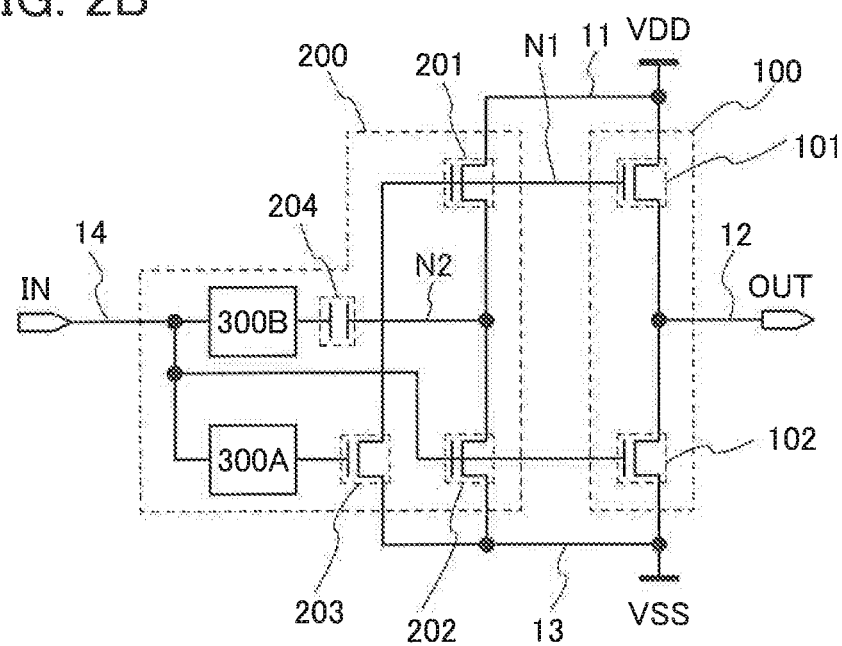

The inverter circuit illustrated in FIG. 2B has a configuration in which a circuit 300B is provided in the inverter circuit in FIG. 2A.

A first terminal of the circuit 300B is connected to the wiring 14. A second terminal of the circuit 300B is connected to the first electrode of the capacitor 204.

The circuit 300B has functions similar to those of the circuit 300A. However, it is preferable that a signal output from the second terminal of the circuit 300B be not delayed and/or distorted largely compared to a signal output from the second terminal of the circuit 300A.

In the inverter circuit in FIG. 2B, the signals output from the second terminal of the circuit 300A and the second terminal of the circuit 300B remain at high level for a predetermined period after the signal IN changes from high level to low level. In other words, the transistor 203 is kept on and the potential VSS continues to be supplied to the node N1 for a predetermined period after the signal IN changes from high level to low level. In addition, a signal input to the first electrode of the capacitor 204 remains at high level for a predetermined period.

After that, even after the signal output from the second terminal of the circuit 300B changes from high level to low level, the signal output from the circuit 300A remains at high level for a predetermined period. In other words, the transistor 203 is kept on and the potential VSS continues to be supplied to the node N1 for a predetermined period after the signal output from the second terminal of the circuit 300B changes from high level to low level.

Consequently, in the inverter circuit in FIG. 2B, the potential of the first electrode of the capacitor 204 can be lowered after the transistor 202 is turned off. In other words, the potential of the node N2 can be lowered by capacitive coupling resulting from the capacitor 204 after the node N2 is assuredly brought into a floating state. Thus, the potential of the node N2 can be further lowered. Further, as in the inverter circuit in FIG. 2A, the potential VSS of the wiring 13 can be supplied to the node N1 in the inverter circuit in FIG. 2B when the potential of the node N2 is lowered by capacitive coupling caused by the capacitor 204, thereby suppressing the decrease in the potential of the node N1 along with the decrease in the potential of the node N2.

The potential difference between the node N1 and the node N2 can be further increased with a synergistic interaction of the ability of the inverter circuit in FIG. 2B to further lower the potential of the node N2 and the ability to suppress the decrease in the potential of the node N1. A larger potential difference between the node N1 and the node N2 can further increase the potential of the node N1 at the time when the potential of the node N2 becomes the potential VDD, resulting in further increase in Vgs of the transistor 101. Consequently, the rise time of the signal OUT can be further shortened.

Figure 3A:
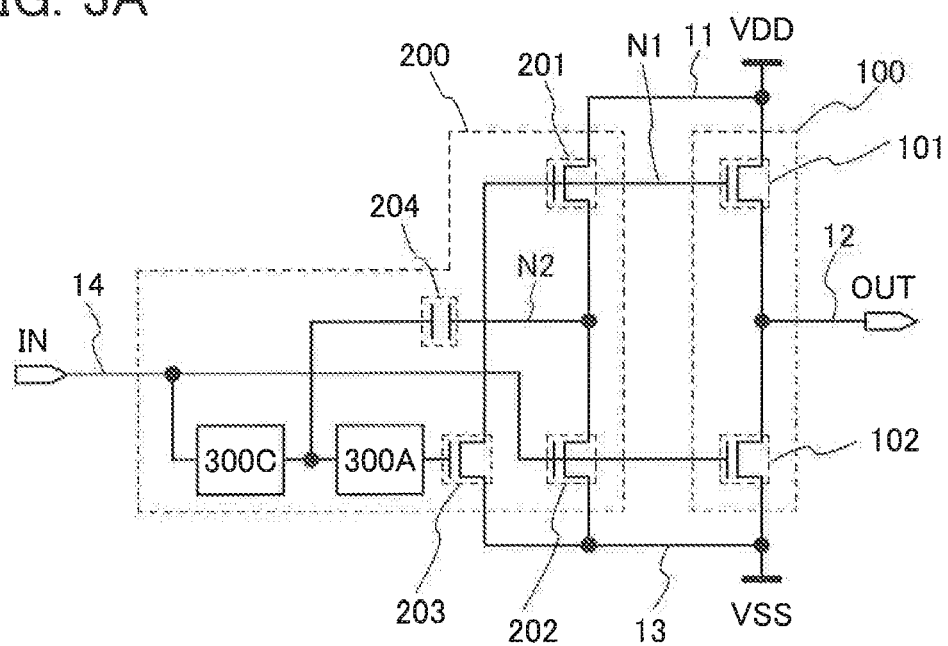
FIGS. 3A and 3B each illustrate an inverter circuit according to one embodiment of the present invention.

The inverter circuit illustrated in FIG. 3A has a configuration in which a circuit 300C is provided in the inverter circuit in FIG. 2A.

A first terminal of the circuit 300C is connected to the wiring 14. A second terminal of the circuit 300C is connected to the first terminal of the circuit 300A and the first electrode of the capacitor 204.

The circuit 300C has functions similar to those of the circuit 300A.

In the inverter circuit in FIG. 3A, signals output from the second terminal of the circuit 300A and the second terminal of the circuit 300C remain at high level for a predetermined period after the signal IN changes from high level to low level. In other words, the transistor 203 is kept on and the potential VSS continues to be supplied to the node N1 for a predetermined period after the signal IN changes from high level to low level. In addition, a signal input to the first electrode of the capacitor 204 remains at high level for a predetermined period.

After that, even after the signal output from the second terminal of the circuit 300C changes from high level to low level, the signal output from the circuit 300A remains at high level for a predetermined period. In other words, the transistor 203 is kept on and the potential VSS continues to be supplied to the node N1 for a predetermined period after the signal output from the second terminal of the circuit 300C changes from high level to low level.

Thus, the inverter circuit in FIG. 3A can operate in a manner similar to that of the inverter circuit in FIG. 2B, and therefore can obtain advantageous effects similar to those of the inverter circuit in FIG. 2B.

Since the circuits 300A and 300C are connected in series in the inverter circuit illustrated in FIG. 3A, the signal output from the second terminal of the circuit 300A is delayed and/or distorted largely compared to the signal output from the second terminal of the circuit 300C. Consequently, the size of the circuit 300A or the size of elements included in the circuit 300A can be reduced.

Figure 3B:
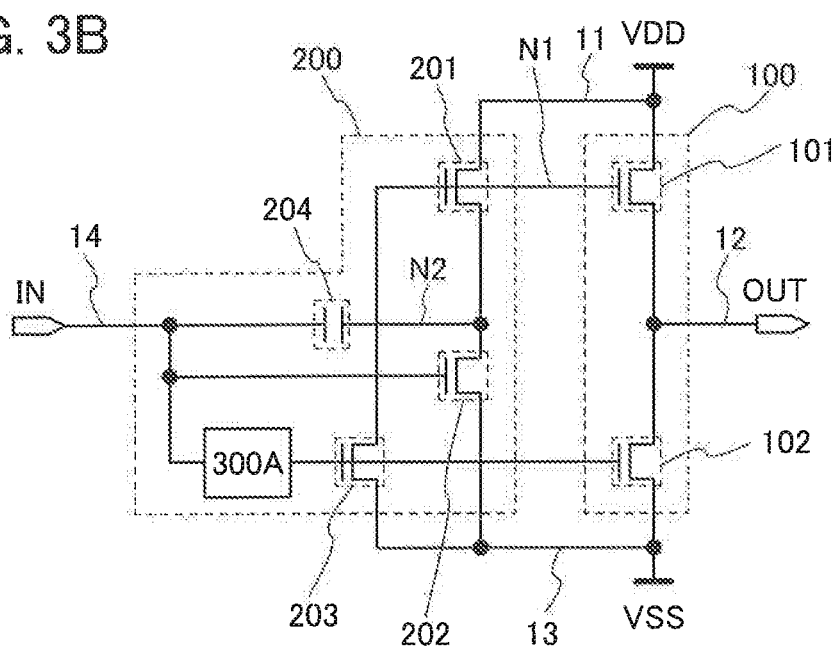

The inverter circuit illustrated in FIG. 3B has a configuration in which the gate of the transistor 102 is connected to the gate of the transistor 203 of the inverter circuit in FIG. 2A.

In the inverter circuit in FIG. 3B, the timing of turning on the transistor 102 can be delayed compared to the case where the gate of the transistor 102 is connected to the wiring 14 without the circuit 300A. As a result, the time during which both the transistors 101 and 102 are on can be shortened. In other words, the through current flowing between the wirings 11 and 13 can be suppressed. Thus, power consumption can be reduced.

Note that as in the inverter circuit in FIG. 3B, the gate of the transistor 102 may be connected to the gate of the transistor 203 in the inverter circuits illustrated in FIGS. 2B and 3A.

Specific examples of configurations of the circuits 300A to 300C will be described with reference to FIGS. 4A to 4F. FIGS. 4A to 4F each illustrate a circuit 300 that can be used as the circuits 300A to 300C.

Figure 4A:
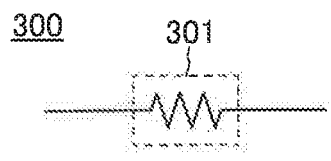
FIGS. 4A to 4F are diagrams each illustrating a circuit used in an inverter circuit according to one embodiment of the present invention.

The circuit 300 illustrated in FIG. 4A includes a resistor 301.

One terminal of the resistor 301 is connected to a first terminal of the circuit 300, and the other terminal of the resistor 301 is connected to a second terminal of the circuit 300.

Figure 4B:
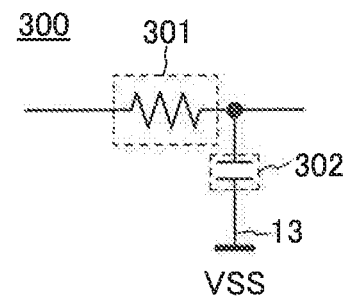

The circuit 300 illustrated in FIG. 4B has a configuration in which a capacitor 302 is provided in the circuit 300 in FIG. 4A.

A first electrode of the capacitor 302 is connected to the wiring 13, and a second electrode of the capacitor 302 is connected to the second terminal of the circuit 300.

Note that the first electrode of the capacitor 302 may be connected to the wiring 11, the wiring 14, or the like.

Note that the second electrode of the capacitor 302 may be connected to the first terminal of the circuit 300.

Figure 4C:
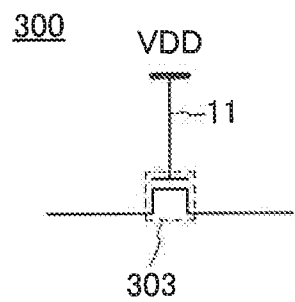

The circuit 300 illustrated in FIG. 4C includes a transistor 303.

A first terminal of the transistor 303 is connected to the first terminal of the circuit 300. A second terminal of the transistor 303 is connected to the second terminal of the circuit 300. A gate of the transistor 303 is connected to the wiring 11.

Figure 4D:
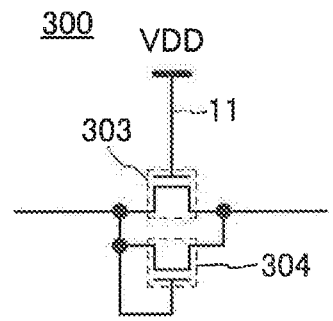

The circuit 300 illustrated in FIG. 4D has a configuration in which a transistor 304 is provided in the circuit 300 in FIG. 4C.

A first terminal of the transistor 304 is connected to the first terminal of the circuit 300. A second terminal of the transistor 304 is connected to the second terminal of the circuit 300. A gate of the transistor 304 is connected to the first terminal of the circuit 300.

In the circuit 300 in FIG. 4D, the transistor 303 is turned on and the transistor 304 is turned off when a signal input to the first terminal is at low level. On the other hand, when the signal input to the first terminal is at high level, both the transistors 303 and 304 are turned on.

Thus, when the signal input to the first terminal is at low level, the circuit 300 in FIG. 4D can delay the inputted signal and output the resulting signal from the second terminal. On the other hand, when the signal input to the first terminal is at high level, the circuit 300 in FIG. 4D can output the signal from the second terminal with negligible signal delay.

Note that the transistor 304 may be provided in the circuit 300 illustrated in FIGS. 4A and 4B.

Figure 4E:
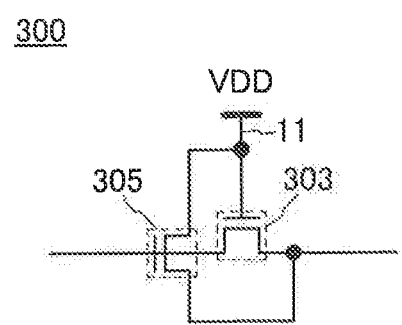

The circuit 300 illustrated in FIG. 4E has a configuration in which a transistor 305 is provided in the circuit 300 in FIG. 4C.

A first terminal of the transistor 305 is connected to the wiring 11. A second terminal of the transistor 305 is connected to the second terminal of the circuit 300. A gate of the transistor 305 is connected to the first terminal of the circuit 300.

In the circuit 300 in FIG. 4E, the transistor 303 is turned on and the transistor 305 is turned off when a signal input to the first terminal is at low level. On the other hand, when the signal input to the first terminal is at high level, both the transistors 303 and 305 are turned on.

Thus, the circuit 300 in FIG. 4E can have advantageous effects similar to those of the circuit 300 in FIG. 4D.

Note that the transistor 305 may be provided in the circuit 300 illustrated in FIGS. 4A, 4B, and the like.

Figure 4F:
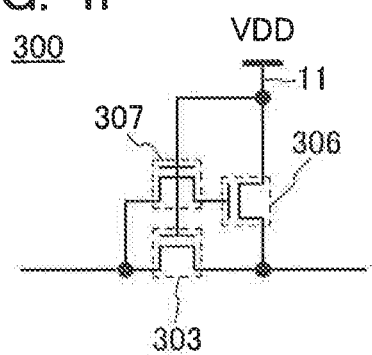

The circuit 300 illustrated in FIG. 4F has a configuration in which a transistor 306 and a transistor 307 are provided in the circuit 300 in FIG. 4C.

A first terminal of the transistor 306 is connected to the wiring 11. A second terminal of the transistor 306 is connected to the second terminal of the circuit 300. A first terminal of the transistor 307 is connected to the first terminal of the circuit 300. A second terminal of the transistor 307 is connected to a gate of the transistor 306. A gate of the transistor 307 is connected to the wiring 11.

In the circuit 300 in FIG. 4F, the transistor 303 is turned on and the transistor 306 is turned off when a signal input to the first terminal is at low level. On the other hand, when the signal input to the first terminal is at high level, both the transistors 303 and 306 are turned on. Note that when the signal input to the first terminal is at high level, the potential of the gate of the transistor 306 is made higher than the potential VDD by bootstrap operation.

Consequently, in the circuit 300 in FIG. 4F, which has advantageous effects similar to those of the circuit 300 in FIG. 4D, a high-level potential of a signal output from the second terminal can be the potential VDD. Further, in the circuit 300 in FIG. 4F, signal delay caused when the signal input to the first terminal is at high level can be smaller than that in the circuit 300 in FIG. 4D.

When the circuit 300 in FIG. 4F is used in the inverter circuit in FIG. 2A, the first electrode of the capacitor 204 may be connected to the gate of the transistor 306. Since the difference between the highest potential and the lowest potential of the gate of the transistor 306 is larger than the amplitude voltage of the signal IN, the potential of the node N2 can be further lowered.

Note that the transistors 306 and 307 may be provided in the circuit 300 illustrated in FIGS. 4A, 4B, and the like.

It is preferable that the conductivity type of the transistors included in the circuit 300 (e.g., the transistors 304 to 307) be the same as that of the transistor 101.

Note that the circuits 300A to 300C do not necessarily have the same configuration, and each of them can have any of the configurations illustrated in FIGS. 4A to 4F as appropriate.

Figure 5A:
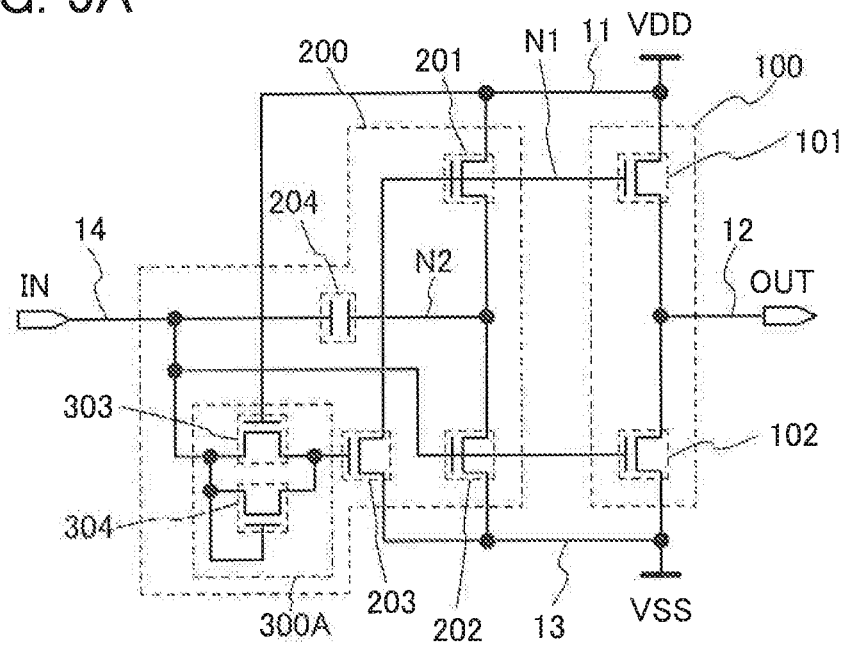
FIGS. 5A and 5B each illustrate an inverter circuit according to one embodiment of the present invention.

FIG. 5A illustrates an example of the configuration of the inverter circuit in which the circuit 300 illustrated in FIG. 4D is used as the circuit 300A in the inverter circuit of FIG. 2A.

Figure 5B:
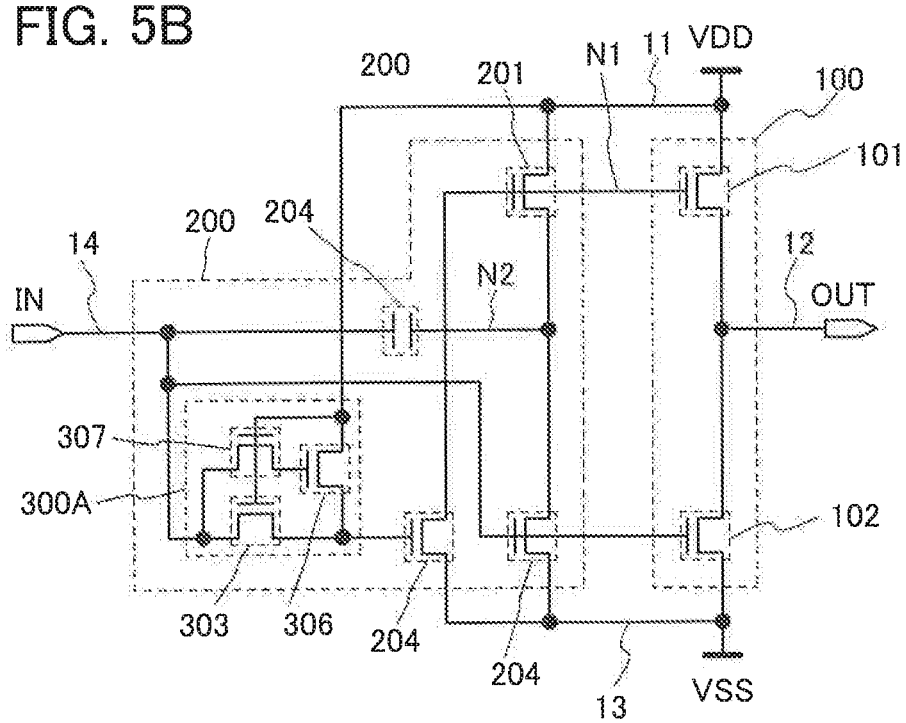

FIG. 5B illustrates an example of the configuration of the inverter circuit in which the circuit 300 illustrated in FIG. 4F is used as the circuit 300A in the inverter circuit of FIG. 2A.

Figure 6A:
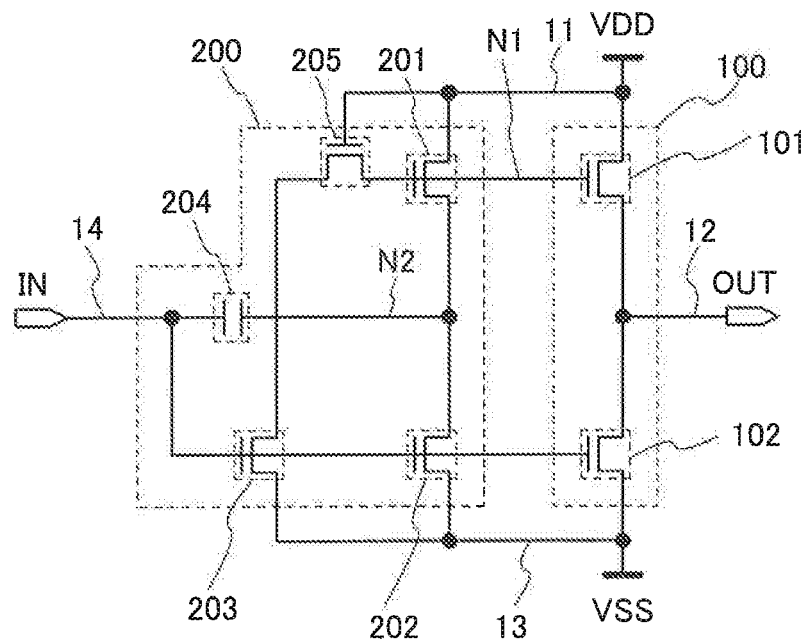
FIGS. 6A and 6B each illustrate an inverter circuit according to one embodiment of the present invention.

The inverter circuit illustrated in FIG. 6A has a configuration in which a transistor 205 is provided in the inverter circuit in FIG. 1A.

A first terminal of the transistor 205 is connected to the second terminal of the transistor 203. A second terminal of the transistor 205 is connected to the gate of the transistor 101 and the gate of the transistor 201. A gate of the transistor 205 is connected to the wiring 11.

The transistor 205 has a function of controlling electrical continuity between the second terminal of the transistor 203 and the gates of the transistors 101 and 201.

In the inverter circuit illustrated in FIG. 6A, in a period during which the signal IN is at low level, the transistor 205 is turned off when the potential of the second terminal of the transistor 203 increases to a potential obtained by subtracting the threshold voltage of the transistor 205 from the potential of the gate of the transistor 205 (the potential VDD). Thus, the potential of the second terminal of the transistor 203 can be lowered, so that deterioration and/or breakdown of the transistor 203 can be prevented.

As in the inverter circuit in FIG. 6A, the transistor 205 may be provided in the inverter circuits illustrated in FIGS. 2A and 2B, FIGS. 3A and 3B, and FIGS. 5A and 5B.

Figure 6B:
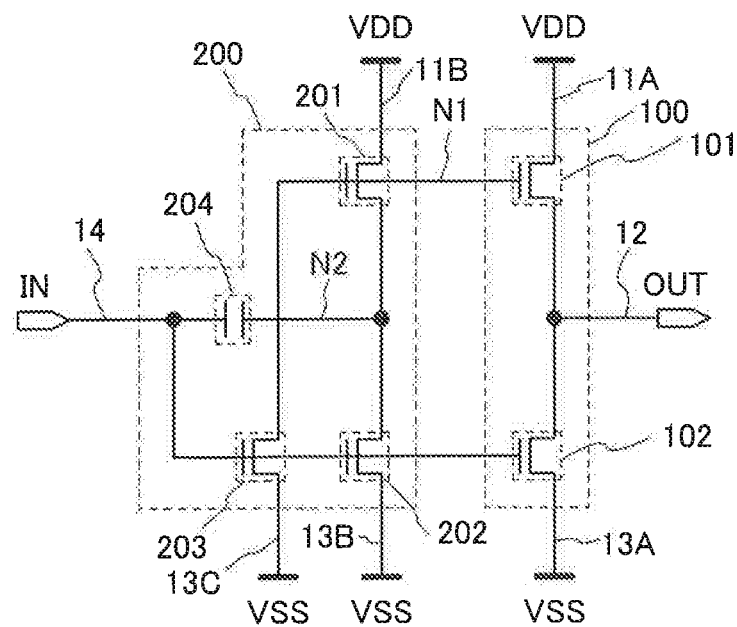

The inverter circuit illustrated in FIG. 6B has a configuration in which each of the wirings 11 and 13 in the inverter circuit in FIG. 1A is divided into a plurality of wirings.

The wiring 11 is divided into a wiring 11A and a wiring 11B. The first terminal of the transistor 101 is connected to the wiring 11A. The first terminal of the transistor 201 is connected to the wiring 11B. The wiring 13 is divided into a wiring 13A, a wiring 13B, and a wiring 13C. The first terminal of the transistor 102 is connected to the wiring 13A. The first terminal of the transistor 202 is connected to the wiring 13B. The first terminal of the transistor 203 is connected to the wiring 13C.

The inverter circuit illustrated in FIG. 6B can operate in a manner similar to that in FIG. 1A when the potential VDD is supplied to the wirings 11A and 11B and the potential VSS is supplied to the wirings 13A to 13C. Note that different potentials may be supplied to the wirings 11A and 11B and that different potentials may be supplied to the wirings 13A to 13C.

Note that only one of the wirings 11 and 13 may be divided into a plurality of wirings.

When the wiring 13 is divided into a plurality of wirings, it is possible that the wiring 13C is omitted and the first terminal of the transistor 203 is connected to the wiring 13A or the wiring 13B. Alternatively, it is possible that the wiring 13A is omitted and the first terminal of the transistor 102 is connected to the wiring 13B or the wiring 13C.

As in the inverter circuit in FIG. 6B, the wiring 11 and/or the wiring 13 may be divided into a plurality of wirings in the inverter circuits illustrated in FIGS. 2A and 2B, FIGS. 3A and 3B, FIGS. 5A and 5B, and FIG. 6A.

Although not illustrated, the inverter circuit illustrated in any of FIG. 1A, FIGS. 2A and 2B, FIGS. 3A and 3B, FIGS. 5A and 5B, and FIGS. 6A and 6B may include a capacitor having a first electrode connected to the second terminal of the transistor 101 and a second electrode connected to the gate of the transistor 101.

Although not illustrated, the inverter circuit illustrated in any of FIG. 1A, FIGS. 2A and 2B, FIGS. 3A and 3B, FIGS. 5A and 5B, and FIGS. 6A and 6B may include a capacitor having a first electrode connected to the second terminal of the transistor 201 and a second electrode connected to the gate of the transistor 201.

Note that a load driven by the transistor 101 (e.g., a load connected to the wiring 12) is larger than a load driven by the transistors 201 to 203 (e.g., a load connected to the node N1 or the node N2). The rise time of the signal OUT can be shortened as W/L of the transistor 101 increases. Thus, W/L of the transistor 101 is preferably higher than that of the transistors 201 to 203.

Similarly, a load driven by the transistor 102 (e.g., a load connected to the wiring 12) is larger than a load driven by the transistors 201 to 203. The fall time of the signal OUT can be shortened as W/L of the transistor 102 increases. Thus, W/L of the transistor 102 is preferably higher than that of the transistors 201 to 203.

Note also that Vgs of the transistor 101 at which the transistor 101 is turned on is often lower than Vgs of the transistor 102 at which the transistor 102 is turned on. Therefore, W/L of the transistor 101 is preferably higher than that of the transistor 102. That is, the transistor 101 preferably has the highest W/L among the transistors included in the inverter circuit of this embodiment.

The inverter circuit in this embodiment operates normally when the low-level potential of the signal IN is low enough to turn off the transistors 102, 202, and 203. For that reason, the low-level potential of the signal IN may be lower than the potential VSS, in which case Vgs of the transistors 201 to 203 at which the transistors 201 to 203 are turned off can be negative voltage. As a result, the inverter circuit can operate normally even if the transistors 201 to 203 are normally-on transistors or if the drain current of the transistors 201 to 203 at the time when the potential difference between their gates and sources is 0 [V] is high.

The inverter circuit in this embodiment operates normally when the high-level potential of the signal IN is high enough to turn on the transistors 102, 202, and 203. For that reason, the high-level potential of the signal IN may be lower than the potential VDD, in which case the voltage for driving a circuit that outputs signals to the wiring 14 can be lowered. In addition, in the inverter circuit of this embodiment, the high-level potential of the signal OUT can be the potential VDD even if the high-level potential of the signal IN is lower than the potential VDD.

The signal IN is not limited to a digital signal as long as it has a potential for turning off the transistors 102, 202, and 203 and a potential for turning on the transistors 102, 202, and 203. For example, the signal IN may have three or more potentials or may be an analog signal.

When a signal such as a clock signal is input to the wiring 11, the signal of the wiring 11 can be output to the wiring 12 in the case where the signal IN is at low level. Specifically, in the case where the wiring 11 is divided into the wirings 11A and 11B as in the inverter circuit illustrated in FIG. 6B, it is preferable that a signal such as a clock signal be input to the wiring 11A and the potential VDD be supplied to the wiring 11B. Thus, the potential of the node N1 can be set high, so that the transistor 101 is likely to be turned on. Consequently, the signal of the wiring 11A can be output to the wiring 12 in a stable manner.

The inverter circuit in this embodiment operates normally when the wiring 13 is supplied with a low-level signal in a period during which the transistors 102, 202, and 203 are on (e.g., a period during which the signal IN is at high level). When the wiring 13 is supplied with a high-level signal in all or part of a period during which the transistors 102, 202, and 203 are off (e.g., a period during which the signal IN is at low level), a reverse bias can be applied to the transistors 102, 202, and 203. Thus, deterioration of the transistors 102, 202, and 203 can be suppressed.

Here, a semiconductor device having the following configuration is one embodiment of the present invention.

Figure 16A:
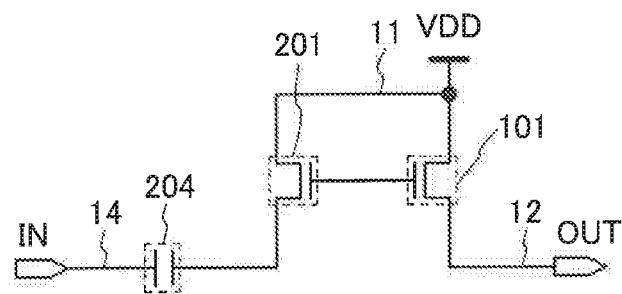
FIGS. 16A to 16C are diagrams for illustrating a semiconductor device according to one embodiment of the present invention.

One embodiment of the present invention is a semiconductor device including the transistor 101, the transistor 201, and the capacitor 204. The first terminal of the transistor 101 is connected to the wiring 11. The second terminal of the transistor 101 is connected to the wiring 12. The first terminal of the transistor 201 is connected to the wiring 11. The gate of the transistor 201 is connected to the gate of the transistor 101. The first electrode of the capacitor 204 is connected to the wiring 14. The second electrode of the capacitor 204 is connected to the second terminal of the transistor 201 (see FIG. 16A).

Figure 16B:
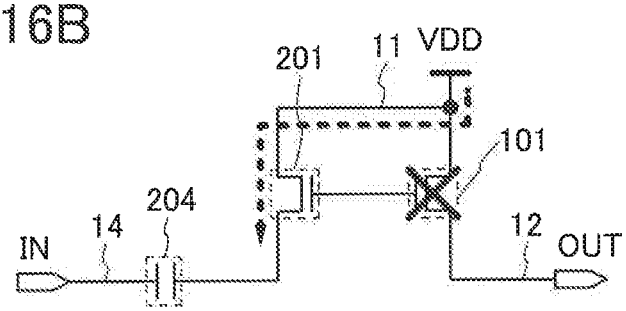
Figure 16C:
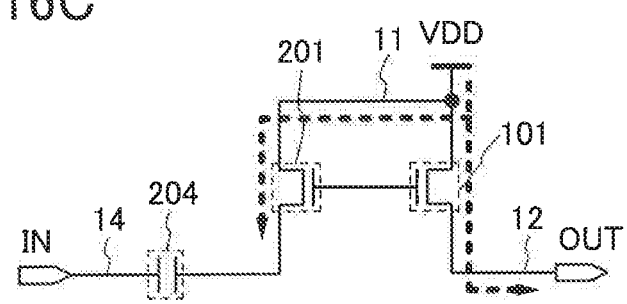
Figure 17A:
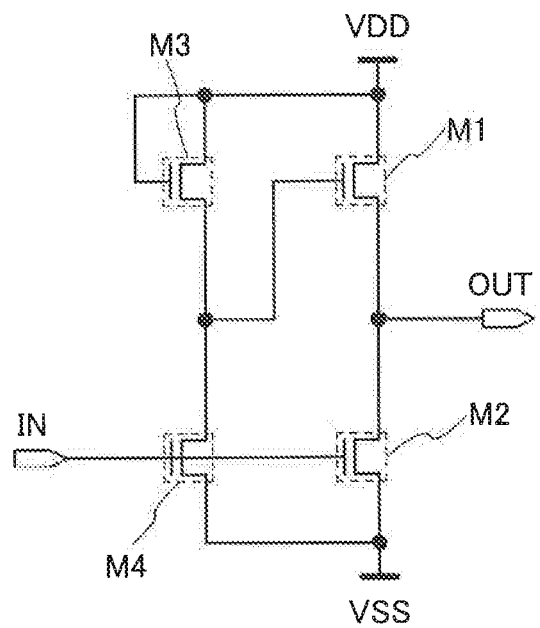
FIGS. 17A and 17B each illustrate a conventional driver circuit.
Figure 17B:
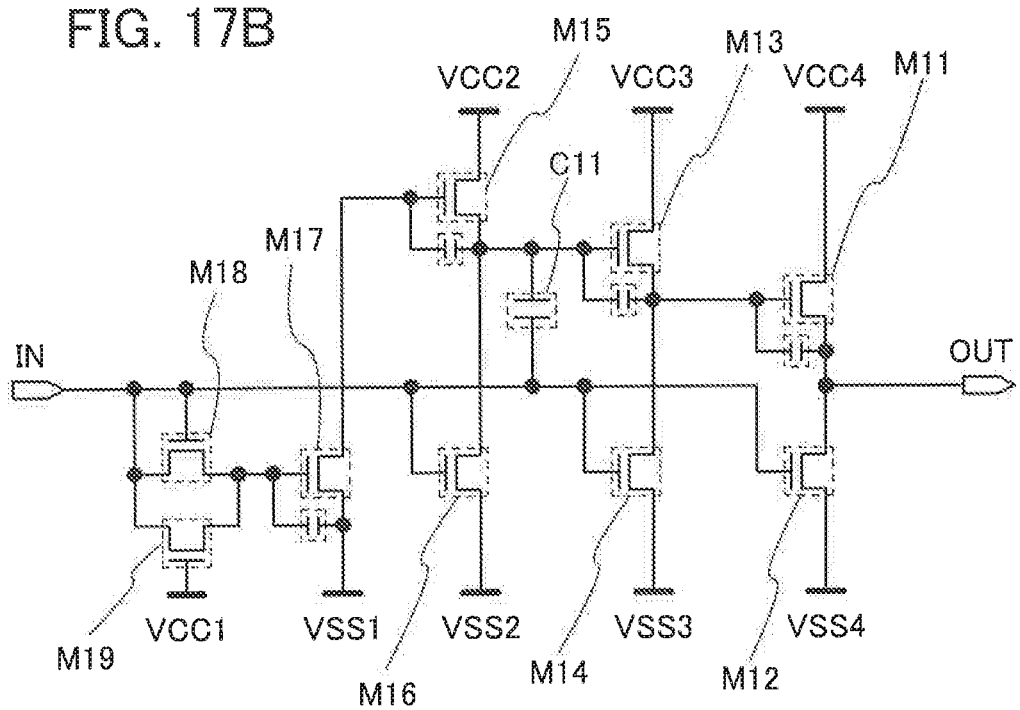

In the above embodiment of the present invention, the potential of the second terminal of the transistor 201 falls along with the decrease in the potential of the wiring 14. By the decrease in the potential of the second terminal of the transistor 201, the transistor 201 is turned on and the potential of the wiring 11 is supplied to the second terminal of the transistor 201, resulting in the increase in the potential of the second terminal of the transistor 201 (see FIG. 16B). Moreover, the potential of the gate of the transistor 201 rises along with the increase in the potential of the second terminal of the transistor 201. By the increase in the potential of the gate of the transistor 201, the transistor 101 is turned on and the potential of the wiring 11 is supplied to the wiring 12, so that the potential of the wiring 12 rises (see FIG. 16C).

This embodiment can be implemented in combination with any other embodiment as appropriate.

Embodiment 2

In Embodiment 2, a shift register circuit (also referred to as "semiconductor device" or "driver circuit") according to one embodiment of the present invention will be described.

A shift register circuit in this embodiment includes a plurality of flip-flop circuits (also referred to as "semiconductor devices" or "driver circuits"). First, a flip-flop circuit will be described, and then a shift register circuit including the flip-flop circuit will be described.

A flip-flop circuit included in the shift register circuit of this embodiment will be described with reference to FIG. 7A.

Figure 7A:
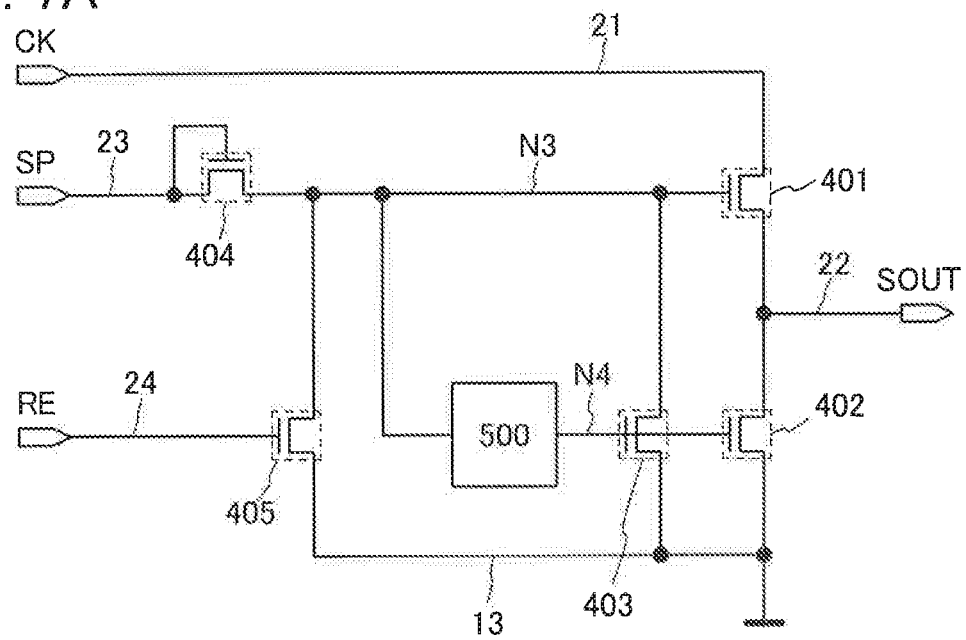
FIGS. 7A and 7B are diagrams for explaining a shift register circuit according to one embodiment of the present invention.

The flip-flop circuit in FIG. 7A includes a transistor 401, a transistor 402, a transistor 403, a transistor 404, a transistor 405, and a circuit 500. A first terminal of the transistor 401 is connected to a wiring 21. A second terminal of the transistor 401 is connected to a wiring 22. A first terminal of the transistor 402 is connected to the wiring 13. A second terminal of the transistor 402 is connected to the wiring 22. A first terminal of the transistor 403 is connected to the wiring 13. A second terminal of the transistor 403 is connected to a gate of the transistor 401. A first terminal of the transistor 404 is connected to a wiring 23. A second terminal of the transistor 404 is connected to the gate of the transistor 401. A gate of the transistor 404 is connected to the wiring 23. A first terminal of the transistor 405 is connected to the wiring 13. A second terminal of the transistor 405 is connected to the gate of the transistor 401. A gate of the transistor 405 is connected to a wiring 24. A first terminal (also referred to as "input terminal") of the circuit 500 is connected to the gate of the transistor 401. A second terminal (also referred to as "output terminal") of the circuit 500 is connected to a gate of the transistor 402 and a gate of the transistor 403.

The circuit 500 can be the inverter circuit described in Embodiment 1. The first terminal of the circuit 500 corresponds to the wiring 14 in the inverter circuit of Embodiment 1, and the second terminal of the circuit 500 corresponds to the wiring 12 in the inverter circuit of Embodiment 1.

Note that a node N3 denotes a point where the gate of the transistor 401, the second terminal of the transistor 403, the second terminal of the transistor 404, the second terminal of the transistor 405, and the first terminal of the circuit 500 are connected to each other. In addition, a node N4 denotes a point where the gate of the transistor 402, the gate of the transistor 403, and the second terminal of the circuit 500 are connected to each other.

Note that the transistors included in the flip-flop circuit in this embodiment preferably have the same conductivity type. For example, in the flip-flop circuit illustrated in FIG. 7A, the transistors 401 to 405 and the transistors included in the circuit 500 preferably have the same conductivity type.

The wiring 21 (also referred to as "signal line") is supplied with a signal CK and has a function of transmitting the signal CK. The signal CK is a clock signal that oscillates between a high and a low state.

The wiring 22 (also referred to as "signal line") outputs a signal SOUT and has a function of transmitting the signal SOUT. The signal SOUT is an output signal of the flip-flop circuit illustrated in FIG. 7A.

The wiring 23 (also referred to as "signal line") is supplied with a signal SP and has a function of transmitting the signal SP. The signal SP is an input signal of the flip-flop circuit illustrated in FIG. 7A.

The wiring 24 (also referred to as "signal line") is supplied with a signal RE and has a function of transmitting the signal RE. The signal RE is an input signal of the flip-flop circuit illustrated in FIG. 7A.

Without limitation to the above signals or potentials, various other signals and potentials can be input to the wirings 21, 23, and 24.

The transistor 401 has a function of controlling electrical continuity between the wiring 21 and the wiring 22, a function of supplying the signal CK of the wiring 21 to the wiring 22, and a function of holding a potential difference between the wiring 22 and the node N3.

The transistor 402 has a function of controlling electrical continuity between the wiring 13 and the wiring 22, and a function of supplying the potential VS S of the wiring 13 to the wiring 22.

The transistor 403 has a function of controlling electrical continuity between the wiring 13 and the node N3, and a function of supplying the potential VSS of the wiring 13 to the node N3.

The transistor 404 has a function of controlling electrical continuity between the wiring 23 and the node N3, and a function of supplying the signal SP of the wiring 23 to the node N3.

The transistor 405 has a function of controlling electrical continuity between the wiring 13 and the node N3, and a function of supplying the potential VSS to the node N3.

Figure 7B:
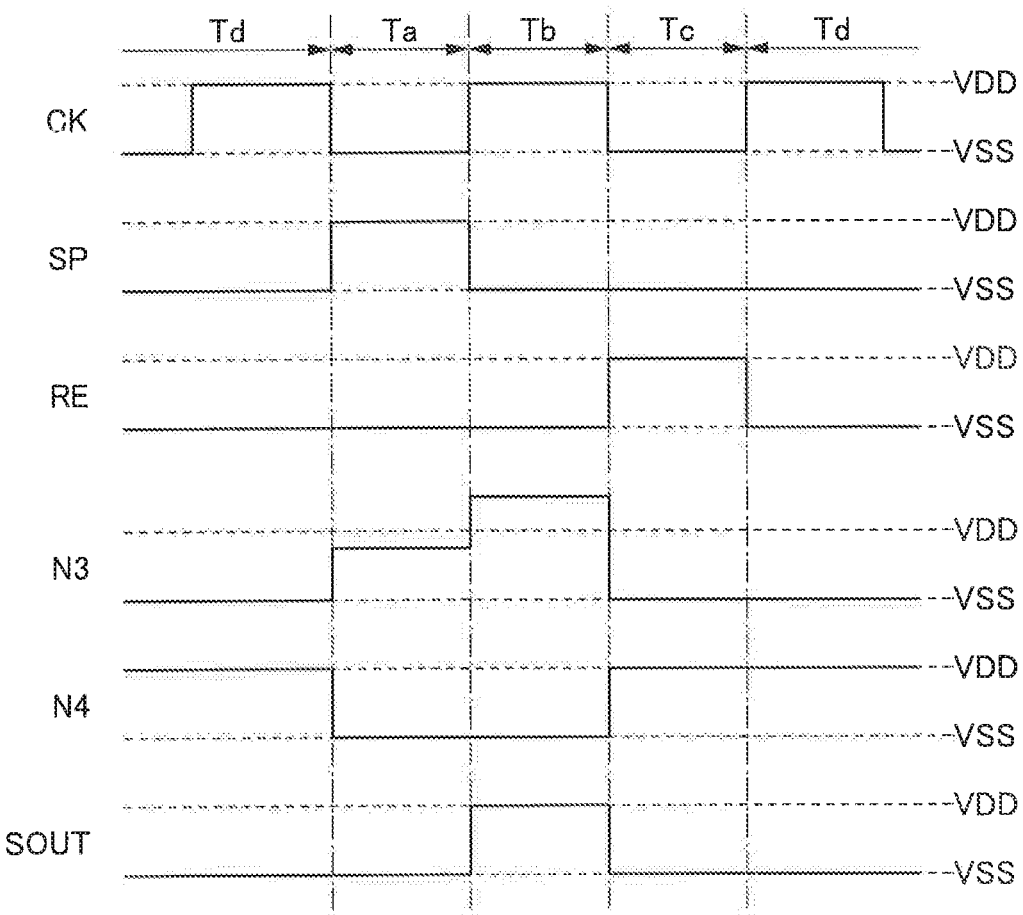

Next, an example of a method of driving the flip-flop circuit illustrated in FIG. 7A will be described with reference to FIG. 7B. FIG. 7B is an example of a timing chart illustrating the method of driving the flip-flop circuit in FIG. 7A.

The following description is made assuming that the signal CK, the signal SP, and the signal RE are digital signals each having a high-level potential equal to the potential VDD and a low-level potential equal to the potential VSS. The operations of the flip-flop circuit in periods Ta, Tb, Tc, and Td are separately described.

In the period Ta, the signal SP is set at high level, the signal RE is set at low level, and the signal CK is set at low level. Thus, the transistor 404 is turned on and the transistor 405 is turned off.

When the transistor 404 is turned on, the signal SP of the wiring 23 is supplied to the node N3. Since the signal SP is at high level, the potential of the node N3 rises. When the potential of the node N3 increases, the output signal of the circuit 500 becomes low. Thus, the transistors 402 and 403 are turned off. Further, the transistor 401 is turned on by the increase in the potential of the node N3.

When the transistor 401 is turned on, the signal CK of the wiring 21 is supplied to the wiring 22. Since the signal CK is at low level, the potential of the wiring 22 becomes the potential VSS. That is, the signal SOUT exists in low level.

The transistor 404 is turned off when the potential of the node N3 increases to a potential obtained by subtracting the threshold voltage of the transistor 404 from the gate potential of the transistor 404 (the potential VDD). Thus, the node N3 is brought into a floating state.

Then, in the period Tb, the signal SP is set at low level, the signal RE is kept at low level, and the signal CK is set at high level. Thus, the transistors 404 and 405 are kept off, and the output signal of the circuit 500 remains at low level. Consequently, the transistors 402 and 403 are kept off.

Since the transistors 403 to 405 remain off, the node N3 is kept in a floating state. As a result, the potential of the node N3 is kept high, so that the transistor 401 is kept on.

Since the transistor 401 remains on, the signal CK of the wiring 21 continues to be supplied to the wiring 22. The potential of the wiring 22 starts to rise because the signal CK is at high level. At this time, the potential difference between the node N3 and the wiring 22 in the period Ta is held between the gate and second terminal of the transistor 401. Thus, the potential of the node N3 rises along with the increase in the potential of the wiring 22. As a result, the potential of the wiring 22 increases to the potential VDD, which is equal to the high-level potential of the signal CK. That is, the signal SOUT becomes high.

Then, in the period Tc, the signal SP remains at low level, the signal RE is set at high level, and the signal CK is set at low level. Thus, the transistor 404 is kept off and the transistor 405 is turned on.

When the transistor 405 is turned on, the potential VSS of the wiring 13 is supplied to the node N3. Thus, the potential of the node N3 decreases to the potential VSS, so that the transistor 401 is turned off. Moreover, the output signal of the circuit 500 becomes high, and the transistors 402 and 403 are turned on.

When the transistor 402 is turned on, the potential VSS of the wiring 13 is supplied to the wiring 22. Thus, the potential of the wiring 22 decreases to the potential VSS. That is, the signal SOUT is changed to low level.

Then, in the period Td, the signal SP remains at low level, the signal RE is set at low level, and the signal CK oscillates between high and low levels. Thus, the transistor 404 is kept off and the transistor 405 is turned off, and the output signal of the circuit 500 remains at high level. Consequently, the transistors 402 and 403 are kept on.

The potential VSS of the wiring 13 continues to be supplied to the node N3 while the transistor 403 is kept on. Thus, the potential of the node N3 remains at the potential VSS, so that the transistor 401 is kept off.

The potential VSS of the wiring 13 continues to be supplied to the wiring 22 while the transistor 402 is kept on. Thus, the potential of the wiring 22 remains at the potential VSS. That is, the signal SOUT remains at low level.

As described above, by including the inverter circuit described in Embodiment 1, the flip-flop circuit illustrated in FIG. 7A can obtain advantageous effects similar to those of the inverter circuit in Embodiment 1.

Next, flip-flop circuits different from the one in FIG. 7A will be described with reference to FIGS. 8A and 8B and FIGS. 9A and 9B. Note that a description of differences from FIG. 7A will be given below.

Figure 8A:
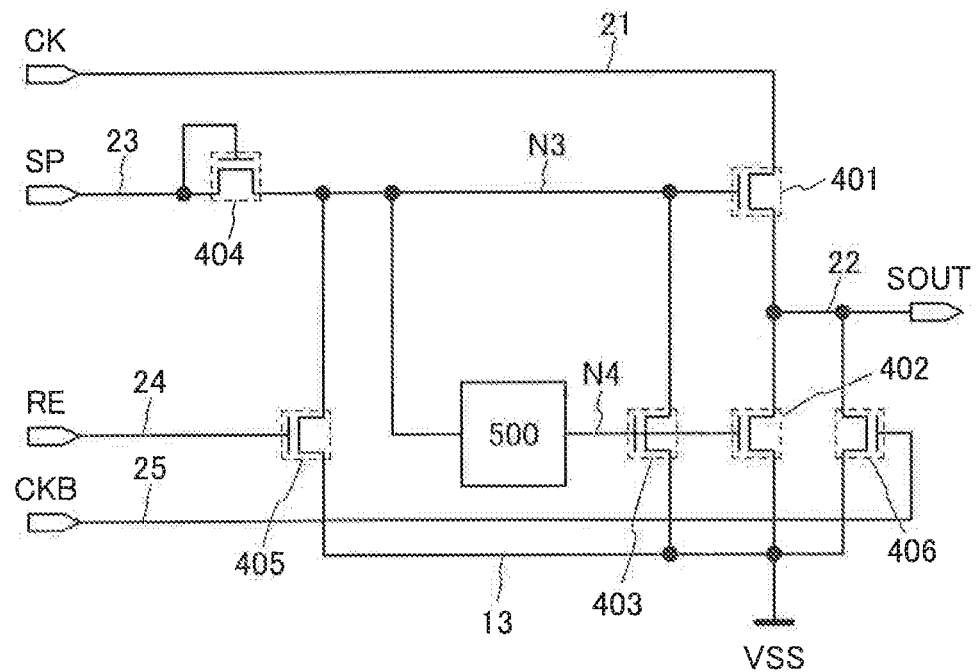
FIGS. 8A and 8B each illustrate a shift register circuit according to one embodiment of the present invention.

The flip-flop circuit illustrated in FIG. 8A has a configuration in which a transistor 406 is provided in the flip-flop circuit in FIG. 7A.

A first terminal of the transistor 406 is connected to the wiring 13. A second terminal of the transistor 406 is connected to the wiring 22. A gate of the transistor 406 is connected to a wiring 25.

The wiring 25 (also referred to as "signal line") is supplied with a signal CKB and has a function of transmitting the signal CKB. The signal CKB is a signal whose phase is inverted with respect to the signal CK or a signal that is out of phase with the signal CK.

The transistor 406 has a function of controlling electrical continuity between the wiring 13 and the wiring 22, and a function of supplying the potential VS S of the wiring 13 to the wiring 22.

In the flip-flop circuit in FIG. 8A, in the period Td, the transistor 406 is turned on every time the signal CKB is set at high level. Accordingly, in the period Td, the potential VSS of the wiring 13 is supplied to the wiring 22 every time the signal CKB is set at high level.

Specifically, in the case where the signal CKB is the inversion signal of the signal CK, the signal CKB is set at high level and the transistor 406 is turned on in the period Ta and the period Tc. Thus, the potential VSS of the wiring 13 is supplied to the wiring 22 through both the transistors 402 and 406 in the period Tc, so that the fall time of the signal SOUT can be shortened.

In the case where the flip-flop circuit includes the transistor 406, the potential of the wiring 22 can be kept at the potential VSS in the period Td. For that reason, the transistor 402 may be omitted, in which case the number of transistors and the layout area can be reduced.

Figure 8B:
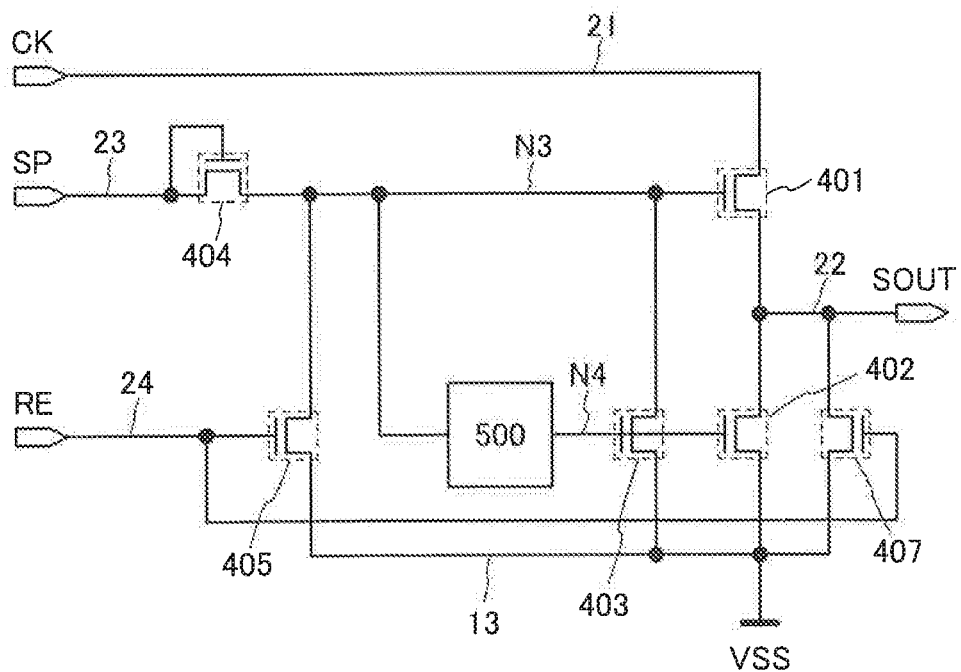

The flip-flop circuit illustrated in FIG. 8B has a configuration in which a transistor 407 is provided in the flip-flop circuit in FIG. 7A.

A first terminal of the transistor 407 is connected to the wiring 13. A second terminal of the transistor 407 is connected to the wiring 22. A gate of the transistor 407 is connected to the wiring 24.

The transistor 407 has a function of controlling electrical continuity between the wiring 13 and the wiring 22, and a function of supplying the potential VS S of the wiring 13 to the wiring 22.

In the flip-flop circuit illustrated in FIG. 8B, the transistor 407 is off in the period Ta, the period Tb, and the period Td and is on in the period Tc. When the transistor 407 is turned on in the period Tc, the potential VSS of the wiring 13 is supplied to the wiring 22.

Thus, the potential VSS of the wiring 13 is supplied to the wiring 22 through both the transistors 402 and 407 in the period Tc, so that the fall time of the signal SOUT can be shortened.

As in the flip-flop circuit in FIG. 8B, the transistor 407 may be provided in the flip-flop circuit in FIG. 8A.

Figure 9A:
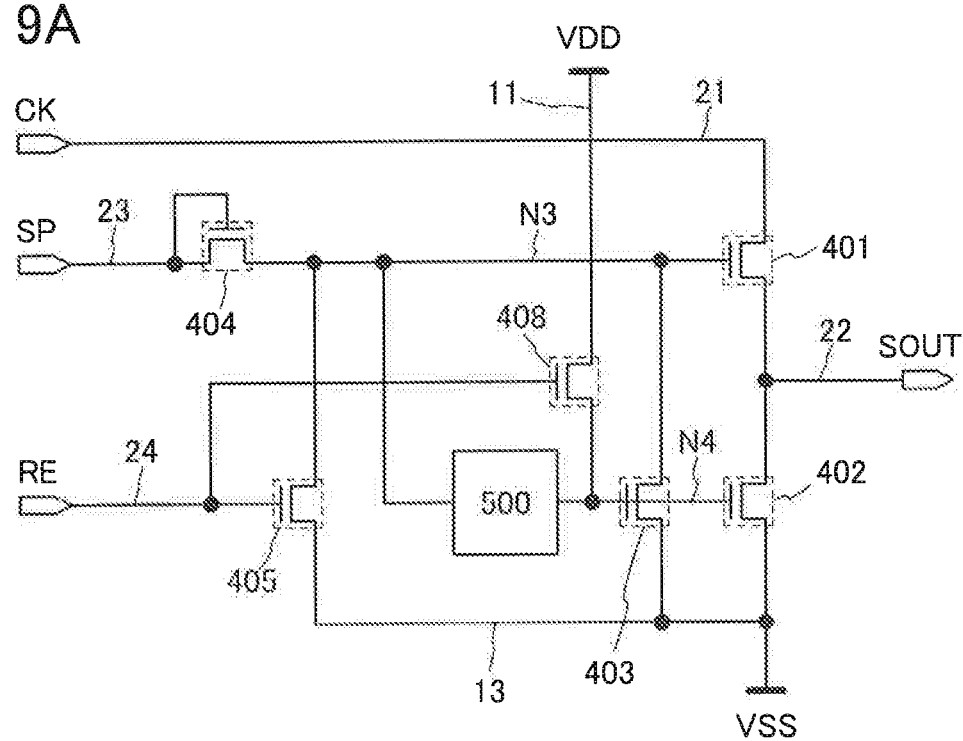
FIGS. 9A and 9B each illustrate a shift register circuit according to one embodiment of the present invention.

The flip-flop circuit illustrated in FIG. 9A has a configuration in which a transistor 408 is provided in the flip-flop circuit in FIG. 7A.

A first terminal of the transistor 408 is connected to the wiring 11. A second terminal of the transistor 408 is connected to the node N4. A gate of the transistor 408 is connected to the wiring 24.

The transistor 408 has a function of controlling electrical continuity between the wiring 11 and the node N4, and a function of supplying the potential VDD of the wiring 11 to the node N4.

In the flip-flop circuit illustrated in FIG. 9A, the transistor 408 is off in the period Ta, the period Tb, and the period Td and is on in the period Tc. When the transistor 408 is turned on in the period Tc, the potential VDD of the wiring 11 is supplied to the node N4.

Consequently, the time required for the potential of the node N4 to reach a predetermined value can be shortened, so that the timing of turning on the transistors 402 and 403 can be advanced. As a result, the timing of supplying the potential VSS of the wiring 13 to the wiring 22 is also advanced, so that the fall time of the signal SOUT can be shortened.

As in the flip-flop circuit in FIG. 9A, the transistor 408 may be provided in the flip-flop circuits in FIGS. 8A and 8B.

In the case where the flip-flop circuit includes the transistor 408, the transistors 402 and 403 are on in the period Tc. For that reason, the transistor 405 may be omitted, in which case the number of transistors and the layout area can be reduced.

Note that the transistor 408 may be used in the flip-flop circuit illustrated in FIG. 8A and its first terminal may be connected to the wiring 25. Even when the first terminal of the transistor 408 is connected to the wiring 25, the signal CKB of the wiring 25 is at high level in the period Tc to allow the transistor 408 to be turned on; therefore, the flip-flop circuit can operate in the above-described manner.

Figure 9B:
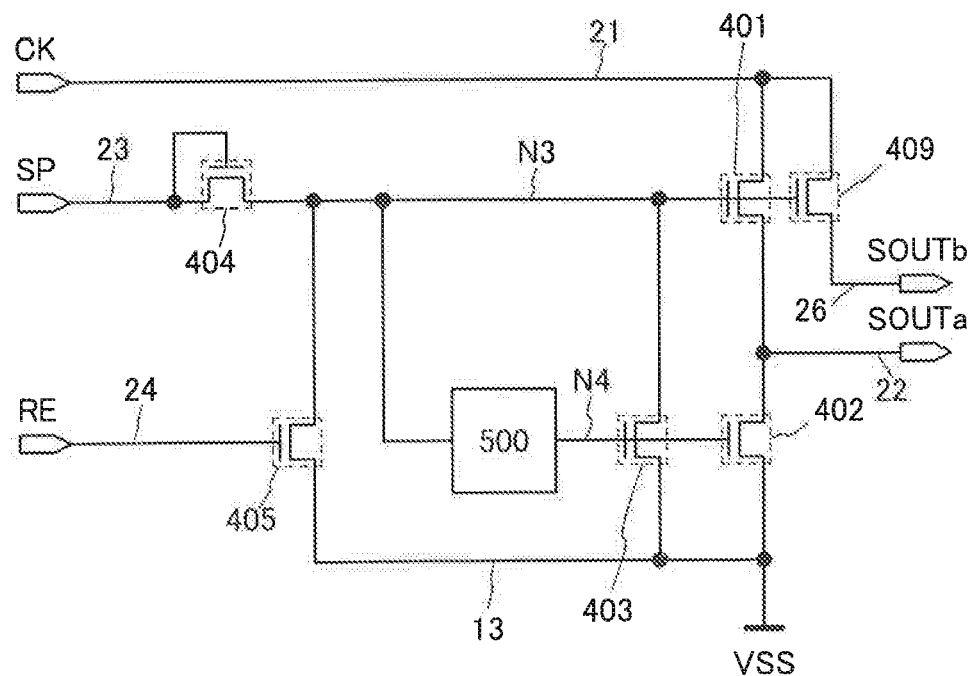

The flip-flop circuit illustrated in FIG. 9B has a configuration in which a transistor 409 is provided in the flip-flop circuit in FIG. 7A.

A first terminal of the transistor 409 is connected to the wiring 21. A second terminal of the transistor 409 is connected to a wiring 26. A gate of the transistor 409 is connected to the node N3.

In the flip-flop circuit illustrated in FIG. 9B, a signal SOUTa denotes a signal output from the wiring 22 and a signal SOUTb denotes a signal output from the wiring 26. The signal SOUTb is also an output signal of the flip-flop circuit. The wiring 26 (also referred to as "signal line") has a function of transmitting the signal SOUTb.

The transistor 409 has functions similar to those of the transistor 401, and for example, has a function of controlling electrical continuity between the wiring 21 and the wiring 26.

The flip-flop circuit in FIG. 9B can generate the signal SOUTb, which is similar to the signal SOUTa. Accordingly, for example, the signal SOUTa can be used to drive a load connected to the wiring 22 and the signal SOUTb can be used to drive a flip-flop circuit in a different stage connected to the wiring 26.

As in the flip-flop circuit in FIG. 9B, the transistor 409 may be provided in the flip-flop circuits in FIGS. 8A and 8B and FIG. 9A.

Although not illustrated, in the flip-flop circuit such as the ones illustrated in FIG. 7A, FIGS. 8A and 8B, and FIGS. 9A and 9B, the first terminal of the transistor 404 may be connected to the wiring 11 or the wiring 25. In that case, the node N3 is supplied with the potential or the signal of the wiring 11 or the wiring 25 in the period Ta, so that the load of a circuit that supplies the signal SP to the wiring 23 can be decreased.

Although not illustrated, the flip-flop circuit such as the ones illustrated in FIG. 7A, FIGS. 8A and 8B, and FIGS. 9A and 9B may include a capacitor having one electrode connected to the wiring 22 and the other electrode connected to the node N3. Providing the capacitor in the flip-flop circuit can increase the capacitance between the gate and second terminal of the transistor 401, so that bootstrap operation can be easily performed.

Although not shown, the flip-flop circuit such as the ones illustrated in FIG. 7A, FIGS. 8A and 8B, and FIGS. 9A and 9B may include a transistor having a first terminal connected to the wiring 22, a second terminal connected to the node N3, and a gate connected to the wiring 21. Accordingly, the potential VSS of the node N3 can be supplied to the wiring 22 or the potential of the wiring 22 can be supplied to the node N3 in a period during which the signal CK is at high level within the period Td. Consequently, one of the transistors 402 and 403 may be omitted, in which case the load of the circuit 500 is decreased and as a result, W/L of the transistors included in the circuit 500 can be reduced.

Although not illustrated, the flip-flop circuit such as the ones illustrated in FIG. 7A, FIGS. 8A and 8B, and FIGS. 9A and 9B may include a transistor having a first terminal connected to the wiring 23, a second terminal connected to the node N3, and a gate connected to the wiring 25. In that case, the potential of the node N3 can be rapidly increased in the period Ta.

Although not shown, in the flip-flop circuit such as the ones illustrated in FIG. 7A, FIGS. 8A and 8B, and FIGS. 9A and 9B, it is possible that a transistor is additionally provided so that its first electrode is connected to the second terminal of the transistor 404, its second terminal is connected to the gate of the transistor 401, and its gate is connected to the wiring 11 or the wiring 25, while the second terminal of the transistor 404 is not connected to the gate of the transistor 401. Accordingly, voltage applied to the transistor 404 and the transistor connected to the second terminal of the transistor 404 can be lowered, whereby deterioration, breakdown, or the like of the transistors can be prevented. Note that the first terminal of the circuit 500 is connected to the second terminal of the transistor 404 or the gate of the transistor 401, and the second terminal of the transistor 405 is connected to the second terminal of the transistor 404 or the gate of the transistor 401.

Although not shown, the flip-flop circuit illustrated in FIG. 9B or the like may include a transistor having a first terminal connected to the wiring 13, a second terminal connected to the wiring 26, and a gate connected to the node N4, the wiring 24, or the wiring 25. In that case, the potential VSS of the wiring 13 can be supplied to the wiring 26, which makes it easier to maintain the potential of the wiring 26 at the potential VSS.

Next, specific examples of flip-flop circuits in which the inverter circuit in Embodiment 1 is used as the circuit 500 will be described.

Figure 10A:
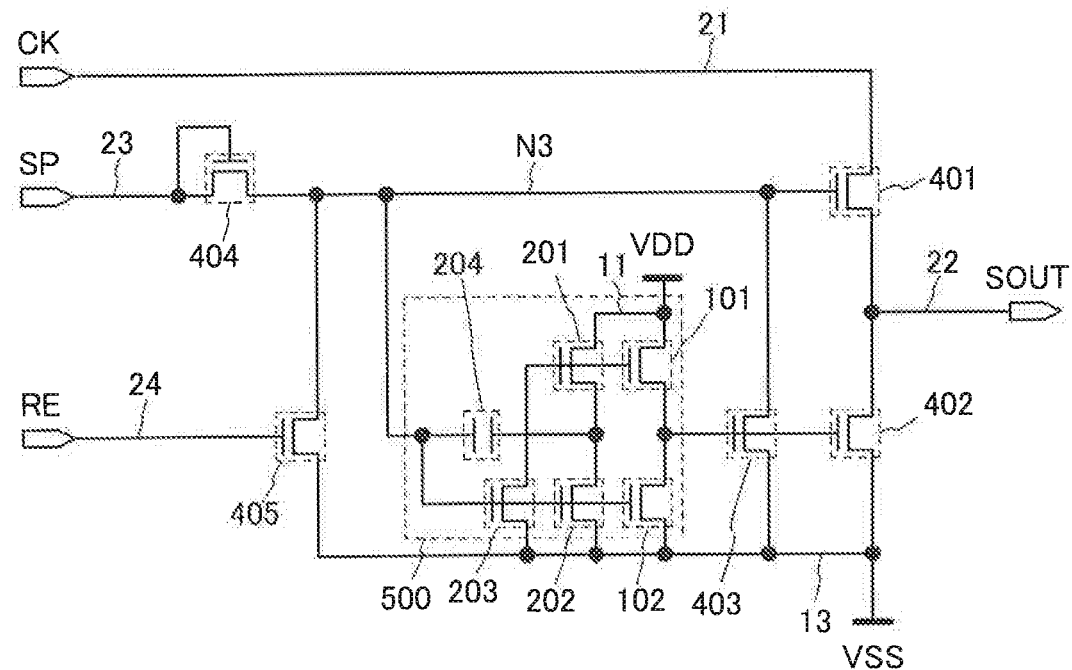
FIGS. 10A and 10B each illustrate a shift register circuit according to one embodiment of the present invention.

A flip-flop circuit illustrated in FIG. 10A has a configuration in which the inverter circuit in FIG. 1A is used as the circuit 500 of the flip-flop circuit in FIG. 7A.

Figure 10B:
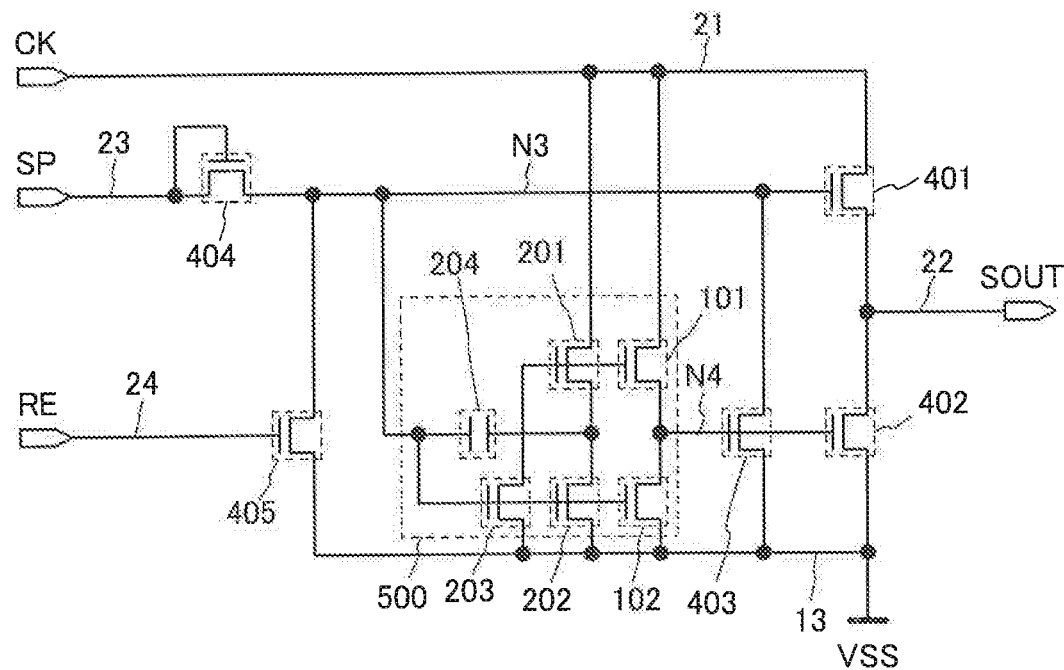

A flip-flop circuit illustrated in FIG. 10B has a configuration in which the first terminals of the transistors 101 and 201 are connected to the wiring 21 in the flip-flop circuit in FIG. 10A.

In the flip-flop circuit illustrated in FIG. 10B, the potential VSS of the wiring 13 is supplied to the node N4 in the period Ta and the period Tb, and the signal CK of the wiring 21 is supplied to the node N4 in the period Tc and the period Td. In the period Td, the supply of the signal CK of the wiring 21 to the node N4 makes the potential of the node N4 switch repeatedly between the potential VDD and the potential VSS, whereby the transistors 402 and 403 are repeatedly turned on and off. In other words, in the period Td, the potential VSS of the wiring 13 is supplied to the wiring 22 at fixed intervals, and the time during which the transistors 402 and 403 are on is shortened. Thus, the potential of the wiring 22 can be maintained at the potential VSS, and deterioration of the transistors 402 and 403 can be suppressed.

In the case where any of the inverter circuits described in Embodiment 1 is used as the circuit 500 in the flip flop circuits such as the ones illustrated in FIGS. 8A and 8B and FIGS. 9A and 9B, the first terminals of the transistors 101 and 201 may be connected to the wiring 21 as in the flip-flop circuit in FIG. 10B.

Next, the shift register circuit in this embodiment will be described with reference to FIG. 11.

Figure 11:
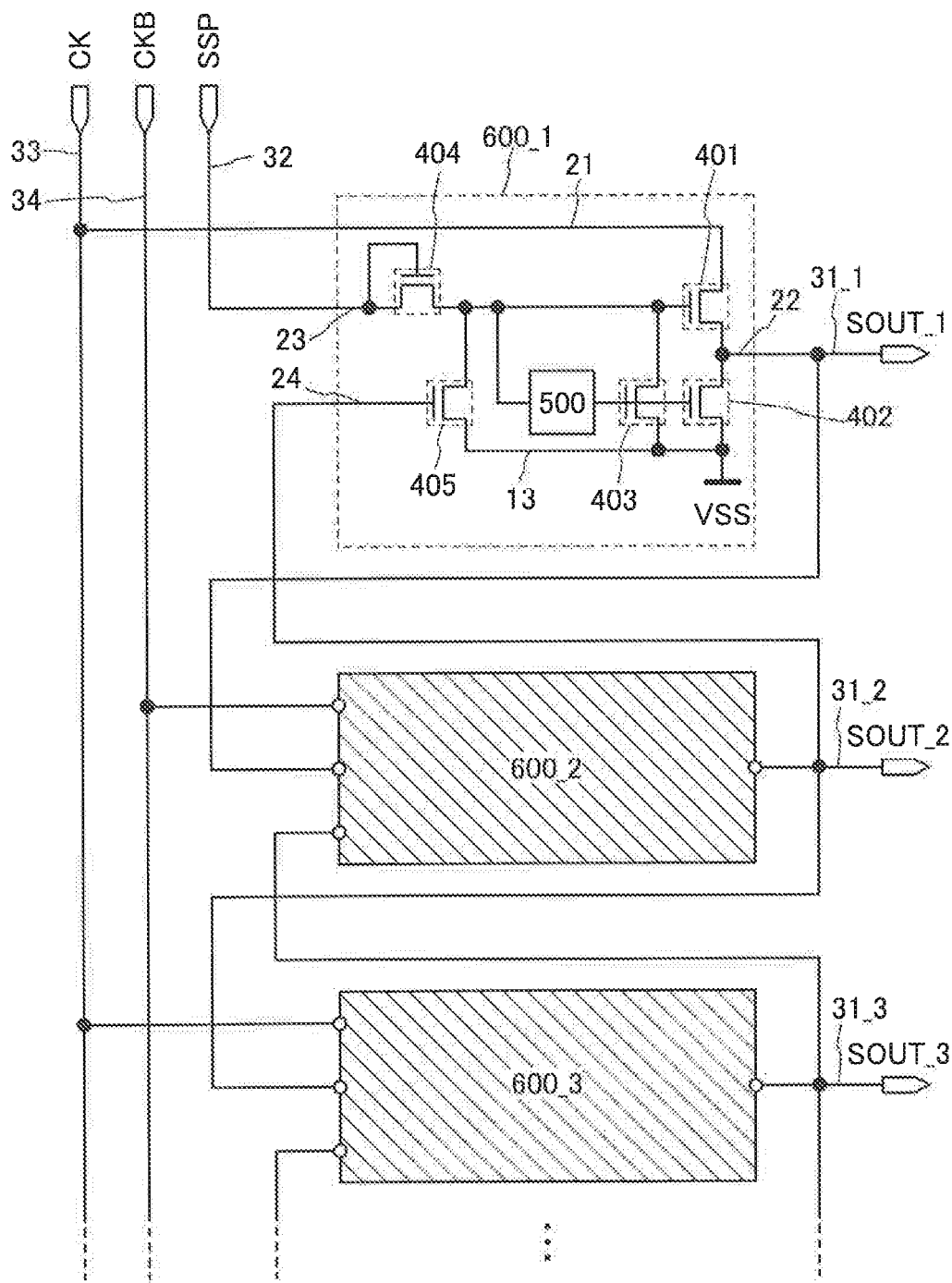
FIG. 11 illustrates a shift register circuit according to one embodiment of the present invention.

The shift register circuit illustrated in FIG. 11 includes N flip-flop circuits 600 (N is a natural number). Note that FIG. 11 only illustrates the flip-flop circuits 600 in first to third stages (flip-flop circuits 600_1, 600_2, and 600_3).

In the shift register circuit in FIG. 11, the flip-flop circuit illustrated in FIG. 7A is used as the flip-flop circuit 600; however, the flip-flop circuit 600 is not limited to the flip-flop circuit in FIG. 7A.

The shift register circuit in FIG. 11 is connected to N wirings 31, a wiring 32, a wiring 33, and a wiring 34. The i-th stage flip-flop circuit 600 (i is one of 2 to N−1) is connected to the wirings 31 in the i-th stage, the (i−1)th stage, and the (i+1)th stage and one of the wirings 33 and 34. Further, in the i-th stage flip-flop circuit 600, the wiring 22 is connected to the i-th stage wiring 31; the wiring 23 is connected to the (i−1)th stage wiring 31; the wiring 24 is connected to the (i+1)th stage wiring 31; and the wiring 21 is connected to the wiring 33 or the wiring 34.

In the case where the wiring 21 is connected to the wiring 33 in the i-th stage flip-flop circuit 600, the wiring 21 is connected to the wiring 34 in the (i−1)th stage and (i+1)th stage flip-flop circuits 600.

The connection relation in the first stage flip-flop circuit 600 is the same as that of the i-th stage flip-flop circuit 600, except that the wiring 23 is connected to the wiring 32 in the first stage flip-flop circuit 600 because there is no (i−1)th stage wiring 31 corresponding to the first stage flip-flop circuit 600.

The connection relation in the N-th stage flip-flop circuit 600 is the same as that of the i-th stage flip-flop circuit 600, except that the wiring 24 is connected to the wiring 32 in the N-th stage flip-flop circuit 600 because there is no (i+1)th stage wiring 31 for the N-th stage flip-flop circuit 600. Note that in the N-th stage flip-flop circuit 600, the wiring 24 may be connected to the wiring 33, the wiring 34, or a wiring to which a signal corresponding to the signal RE is input.

Signals SOUT_1 to SOUT_N are output from the respective N wirings 31 (also referred to as "signal lines"). The N wirings 31 have a function of transmitting the signals SOUT_1 to SOUT_N. For example, the signal SOUT_i is output from the i-th stage wiring 31, which has a function of transmitting the signal SOUT_i.

The wiring 32 (also referred to as "signal line") is supplied with a signal SSP and has a function of transmitting the signal SSP. The signal SSP is a start pulse of the shift register circuit in FIG. 11.

The wiring 33 (also referred to as "signal line") is supplied with the signal CK and has a function of transmitting the signal CK.

The wiring 34 (also referred to as "signal line") is supplied with the signal CKB and has a function of transmitting the signal CKB.

Without limitation to the above signals or potentials, various other signals and potentials can be input to the wirings 32 to 34.

This embodiment can be implemented in combination with any other embodiment as appropriate.

Embodiment 3

Figure 12:
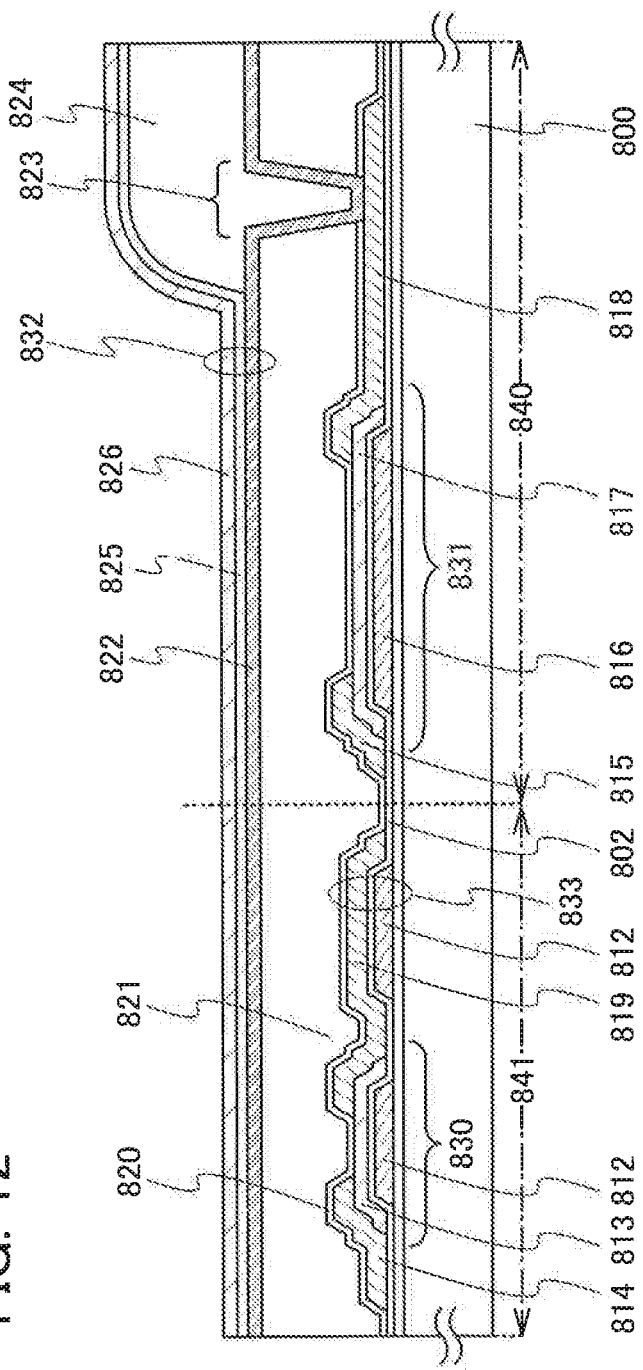
FIG. 12 illustrates a display device according to one embodiment of the present invention.

Using an EL display device as an example, cross-sectional structures of a pixel and a driver circuit of a display device according to one embodiment of the present invention will be described with reference to FIG. 12. FIG. 12 exemplifies cross-sectional structures of a pixel 840 and a driver circuit 841.

The pixel 840 includes a light-emitting element 832 and a transistor 831 having a function of supplying current to the light-emitting element 832. In addition to the light-emitting element 832 and the transistor 831, the pixel 840 may also include a variety of semiconductor elements such as a transistor that controls input of an image signal to the pixel 840 and a capacitor that holds the potential of an image signal.

The driver circuit 841 includes a transistor 830 and a capacitor 833 for holding the gate voltage of the transistor 830. The driver circuit 841 corresponds to the inverter circuit in Embodiment 1 or the flip-flop circuit or the shift register circuit in Embodiment 2, for example Specifically, the transistor 830 corresponds to the transistor 101 in Embodiment 1 or the transistor 401 in Embodiment 2, for example. The driver circuit 841 may also include a variety of semiconductor elements such as a transistor and a capacitor in addition to the transistor 830 and the capacitor 833.

The transistor 831 includes, over a substrate 800 having an insulating surface, a conductive film 816 functioning as a gate, a gate insulating film 802 over the conductive film 816, a semiconductor film 817 that overlaps the conductive film 816 with the gate insulating film 802 placed therebetween, and conductive films 815 and 818 that are positioned over the semiconductor film 817 and function as a source terminal and a drain terminal. The conductive film 816 also functions as a scan line.

The transistor 830 includes, over the substrate 800 having an insulating surface, a conductive film 812 functioning as a gate, the gate insulating film 802 over the conductive film 812, a semiconductor film 813 that overlaps the conductive film 812 with the gate insulating film 802 placed therebetween, and conductive films 814 and 819 that are positioned over the semiconductor film 813 and function as a source terminal and a drain terminal.

The capacitor 833 includes, over the substrate 800 having an insulating surface, the conductive film 812, the gate insulating film 802 over the conductive film 812, and the conductive film 819 that overlaps the conductive film 812 with the gate insulating film 802 placed therebetween.

An insulating film 820 and an insulating film 821 are stacked in this order over the conductive films 814, 815, 818, and 819. A conductive film 822 functioning as an anode is formed over the insulating film 821. The conductive film 822 is connected to the conductive film 818 through a contact hole 823 formed in the insulating films 820 and 821.

An insulating film 824 having an opening where part of the conductive film 822 is exposed is provided over the insulating film 821. An EL layer 825 and a conductive film 826 functioning as a cathode are stacked in this order over the part of the conductive film 822 and the insulating film 824. A region where the conductive film 822, the EL layer 825, and the conductive film 826 overlap one another corresponds to the light-emitting element 832.

In one embodiment of the present invention, the transistors 830 and 831 may include a semiconductor film containing an amorphous, microcrystalline, polycrystalline, or single crystal semiconductor (e.g., silicon or germanium), or a semiconductor film containing a wide bandgap semiconductor such as an oxide semiconductor.

When the semiconductor films of the transistors 830 and 831 are formed using an amorphous, microcrystalline, polycrystalline, or single crystal semiconductor (e.g., silicon or germanium), impurity regions functioning as source and drain terminals are formed by addition of an impurity element imparting one conductivity to the semiconductor films. For example, an impurity region having n-type conductivity can be formed by addition of phosphorus or arsenic to the semiconductor film. Further, an impurity region having p-type conductivity can be formed by addition of boron, for instance, to the semiconductor film.

In the case where an oxide semiconductor is used for the semiconductor films of the transistors 830 and 831, impurity regions functioning as source and drain terminals may be formed by addition of a dopant to the semiconductor films. The dopant can be added by ion implantation. Examples of the dopant are a rare gas such as helium, argon, and xenon; and a Group 15 element such as nitrogen, phosphorus, arsenic, and antimony. For example, when nitrogen is used as the dopant, the concentration of nitrogen atoms in the impurity region preferably ranges from $5 \times 10^{19}$/cm$^3$ to $1 \times 10^{22}$/cm$^3$.

As a silicon semiconductor, any of the following can be used, for example, amorphous silicon formed by sputtering or vapor phase growth such as plasma CVD, polycrystalline silicon obtained in such a manner that amorphous silicon is crystallized by laser annealing or the like, and single crystal silicon obtained in such a manner that a surface portion of a single crystal silicon wafer is separated after implantation of hydrogen ions or the like into the silicon wafer.

The oxide semiconductor film includes at least one element selected from In, Ga, Sn, and Zn. Examples of the oxide semiconductor are an oxide of four metal elements, such as an In—Sn—Ga—Zn—O-based oxide semiconductor; oxides of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; oxides of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based material; and oxides of one metal element, such as an In—O-based oxide semiconductor, a Sn—O-based oxide semiconductor, and a Zn—O-based oxide semiconductor. In addition, any of the above oxide semiconductors may contain an element other than In, Ga, Sn, and Zn, for example, SiO$_2$.

For example, an In—Ga—Zn—O-based oxide semiconductor refers to an oxide containing indium (In), gallium (Ga), and zinc (Zn), and there is no limitation on the composition thereof.

For the oxide semiconductor film, a thin film expressed by a chemical formula of InMO$_3$(ZnO)$_m$, (m>0) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as an oxide semiconductor, the atomic ratio of metal elements in a target to be used is In:Zn=50:1 to 1:2 (In$_2$O$_3$:ZnO=25:1 to 1:4 in a molar ratio), preferably In:Zn=20:1 to 1:1 (In$_2$O$_3$:ZnO=10:1 to 1:2 in a molar ratio), further preferably In:Zn=15:1 to 1.5:1 (In$_2$O$_3$:ZnO=15:2 to 3:4 in a molar ratio). For example, in a target used for forming an In—Zn—O-based oxide semiconductor with an atomic ratio of In:Zn:O=X:Y:Z, the relation of Z□□1.5X+□Y is satisfied. The mobility can be increased by keeping the ratio of Zn within the above range.

Note that a purified oxide semiconductor obtained by reduction of impurities serving as electron donors (donors), such as moisture or hydrogen, and by reduction of oxygen defects is an i-type (intrinsic) semiconductor or a substantially i-type semiconductor. A transistor including the purified oxide semiconductor therefore has extremely low off-state current. The band gap of the oxide semiconductor is 2 eV or more, preferably 2.5 eV or more, further preferably 3 eV or more. With the use of an oxide semiconductor film that is highly purified by sufficient decrease in the concentration of impurities such as moisture and hydrogen and reduction of oxygen defects, the off-state current of a transistor can be decreased.

Specifically, various experiments can prove low off-state current of a transistor in which a purified oxide semiconductor is used for a semiconductor film. For example, the off-state current of even a transistor with a channel width of $1 \times 10^6$ μm and a channel length of 10 μm can be less than or equal to the measurement limit of a semiconductor parameter analyzer, that is, less than or equal to $1 \times 10^{-13}$ A when the voltage between a source terminal and a drain terminal (drain voltage) ranges from 1 V to 10 V. In that case, the off-state current density corresponding to a value obtained by dividing the off-state current by the channel width of the transistor is 100 zA/μm or less. In addition, the off-state current has been measured using a circuit in which a capacitor and a transistor were connected to each other and charge flowing into or from the capacitor was controlled by the transistor. For the measurement, the transistor in which a channel formation region is formed in a purified oxide semiconductor film has been used, and the off-state current density of the transistor has been measured from a change in the amount of charge of the capacitor per unit time. As a result, it has been proven that an extremely low off-state current density of several tens of yoctoamperes per micrometer (yA/μm) is obtained at a voltage between the source terminal and the drain terminal of the transistor of 3 V. Consequently, it can be understood that the off-state current of the transistor in which the channel formation region is formed in the purified oxide semiconductor film is significantly lower than that of a transistor using crystalline silicon.

Unless otherwise specified, in this specification, the off-state current of an re-channel transistor is a current that flows between a source terminal and a drain terminal when the potential of a gate is lower than or equal to 0 with the potential of the source terminal as a reference potential while the potential of the drain terminal is higher than those of the source terminal and the gate. Moreover, in this specification, the off-state current of a p-channel transistor is a current that flows between a source terminal and a drain terminal when the potential of a gate is higher than or equal to 0 with the potential of the source terminal as a reference potential while the potential of the drain terminal is lower than those of the source terminal and the gate.

An oxide semiconductor film can be formed, for example, by sputtering using a target including indium (In), gallium (Ga), and zinc (Zn). When an In—Ga—Zn-based oxide semiconductor film is formed by sputtering, it is preferable to use an In—Ga—Zn-based oxide target having an atomic ratio of In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or a c-axis-aligned crystal (CAAC), which is described below, is readily formed.

The filling rate of the target including In, Ga, and Zn is 90% or higher and 100% or lower, preferably 95% or higher and lower than 100%. With the use of the target with high filling rate, a dense oxide semiconductor film is formed.

Specifically, the oxide semiconductor film may be formed as follows: the substrate is held in a treatment chamber with pressure reduced, a sputtering gas from which hydrogen and moisture are removed is introduced while residual moisture in the treatment chamber is removed, and the above-described target is used. The substrate temperature during film formation may range from 100° C. to 600° C., preferably from 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom and a compound containing a hydrogen atom, such as water ($H_2O$) (preferably, a compound containing a carbon atom as well) are removed, whereby the impurity concentration in the oxide semiconductor film formed in the chamber can be reduced.

Note that the oxide semiconductor film formed by sputtering or the like sometimes contains a large amount of moisture or hydrogen (including a hydroxyl group) as impurities. Moisture and hydrogen easily form a donor level and thus serve as impurities in the oxide semiconductor. In one embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra-dry air (the moisture amount is 20 ppm (−55° C. by conversion into a dew point) or less, preferably 1 ppm or less, further preferably 10 ppb or less in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film and an oxygen defect is formed in the oxide semiconductor film. To prevent an oxygen defect, an insulating film including oxygen is used as an insulating film in contact with the oxide semiconductor film, such as a gate insulating film, in one embodiment of the present invention. Then, heat treatment is performed after formation of the insulating film including oxygen, so that oxygen is supplied from the insulating film to the oxide semiconductor film With the above structure, oxygen defects serving as donors can be reduced in the oxide semiconductor film and the stoichiometric composition of the oxide semiconductor included in the oxide semiconductor film can be satisfied. It is preferable that the proportion of oxygen in the oxide semiconductor film is higher than that in the stoichiometric composition. As a result, the oxide semiconductor film can be made substantially i-type and variations in electrical characteristics of transistors due to oxygen defects can be reduced; thus, electrical characteristics can be improved.

The heat treatment for supplying oxygen to the oxide semiconductor film is performed in a nitrogen atmosphere, ultra-dry air, or a rare gas (e.g., argon or helium) atmosphere preferably at temperatures ranging from 200° C. to 400° C., for example, from 250° C. to 350° C. It is preferable that the water content in the gas be 20 ppm or less, preferably 1 ppm or less, further preferably 10 ppb or less.

The oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystalline parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, a grain boundary in the CAAC-OS film is not found with the TEM. Thus, reduction in electron mobility due to the grain boundary is suppressed in the CAAC-OS film.

In each of the crystal parts included in the CAAC-OS film, the c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a term "perpendicular" includes a range from 85° to 95° unless otherwise specified. In addition, a term "parallel" includes a range from −5° to 5° unless otherwise specified.

In the CAAC-OS film, distribution of crystal parts is not necessarily uniform. For example, when crystal growth occurs from a surface side of the oxide semiconductor film in the process of forming the CAAC-OS film, the proportion of crystal parts in the vicinity of the surface of the oxide semiconductor film is sometimes higher than that in the vicinity of the surface over which the oxide semiconductor film is deposited. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of the surface where the CAAC-OS film is formed or a normal vector of the surface of the CAAC-OS film, the directions of the c-axes may be different from each other depending on the shape of the CAAC-OS film (the cross-sectional shape of the surface over which the CAAC-OS film is deposited or the cross-sectional shape of the surface of the CAAC-OS film). The crystal part is formed during deposition or by performing treatment for crystallization such as heat treatment after deposition.

With the use of the CAAC-OS film, the change in electric characteristics of the transistor due to irradiation with visible light or ultraviolet light can be reduced. Thus, the transistor has high reliability.

Note that part of oxygen included in the oxide semiconductor film may be substituted with nitrogen.

The CAAC-OS film is formed by sputtering using a polycrystalline oxide semiconductor sputtering target, for example. When ions collide with the sputtering target, a crystal region included in the sputtering target might be separated from the target along the a-b plane; in other words, sputtered particles having a plane parallel to the a-b plane (flat plate-like sputtered particles or pellet-like sputtered particles) might flake off from the sputtering target. In that case, the flat plate-like sputtered particles might be able to reach a substrate while maintaining their shape, whereby the CAAC-OS film might be formed.

The CAAC-OS film is preferably deposited under the following conditions.

Deformation of the crystal due to impurities can be prevented by reducing the amount of impurities entering the CAAC-OS film during the deposition, for example, by reducing the concentration of impurities (e.g., hydrogen, water, and carbon dioxide) that exist in the deposition chamber or by reducing the concentration of impurities in a deposition gas. Specifically, a deposition gas with a dew point of −80° C. or lower, preferably −100° C. or lower is used.

Increase in the substrate heating temperature during the deposition might promote migration of sputtered particles after the sputtered particles reach a substrate surface. Hence, the substrate heating temperature during the deposition is set from 100° C. to 740° C., preferably from 200° C. to 500° C. By increasing the substrate heating temperature during the deposition, a flat plate-like sputtered particle which reaches the substrate undergoes migration on the substrate surface, so that the film of the oxide semiconductor is formed with a flat plane of the flat plate-like sputtered particle parallel to the substrate.

It is preferable that the proportion of oxygen in the deposition gas be increased and the electric power be optimized in order to reduce plasma damage at the deposition. The proportion of oxygen in the deposition gas is 30 vol % or higher, preferably 100 vol %.

As an example of the sputtering target, an In—Ga—Zn—O compound target will be described below.

A polycrystalline In—Ga—Zn—O compound target is made by mixing $InO_X$ powder, $GaO_Y$ powder, and $ZnO_Z$ powder at a predetermined molar ratio, applying pressure to the mixture, and then performing heat treatment on the mixture at temperatures ranging from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing the powder can be determined as appropriate depending on a desired sputtering target.

Next, examples of a specific structure of a transistor included in the semiconductor device according to the present invention will be described.

Figure 13A:
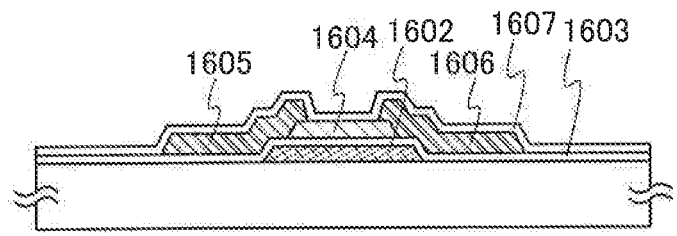
FIGS. 13A to 13D each illustrate a transistor according to one embodiment of the present invention.

A transistor illustrated in FIG. 13A is a bottom-gate transistor with a channel-etched structure.

The transistor illustrated in FIG. 13A includes a gate electrode (gate) 1602 formed on an insulating surface, a gate insulating film 1603 over the gate electrode 1602, a semiconductor film 1604 that overlaps the gate electrode 1602 with the gate insulating film 1603 placed therebetween, and conductive films 1605 and 1606 formed over the semiconductor film 1604. An insulating film 1607 formed over the semiconductor film 1604 and the conductive films 1605 and 1606 may be considered as a component of the transistor.

The transistor in FIG. 13A may also include a backgate electrode that overlaps the semiconductor film 1604 with the insulating film 1607 placed therebetween.

Figure 13B:
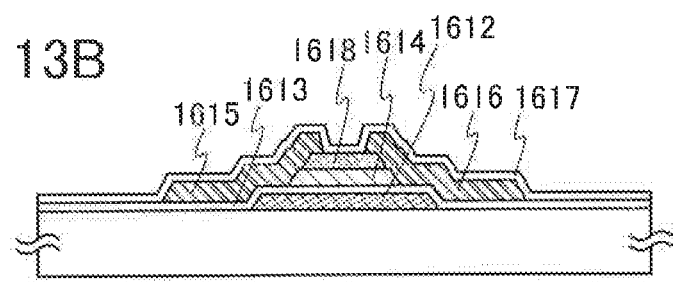

A transistor illustrated in FIG. 13B is a bottom-gate transistor with a channel protective structure.

The transistor illustrated in FIG. 13B includes a gate electrode 1612 formed on an insulating surface, a gate insulating film 1613 over the gate electrode 1612, a semiconductor film 1614 that overlaps the gate electrode 1612 with the gate insulating film 1613 placed therebetween, a channel protective film 1618 formed over the semiconductor film 1614, and conductive films 1615 and 1616 formed over the semiconductor film 1614. An insulating film 1617 formed over the channel protective film 1618 and the conductive films 1615 and 1616 may be considered as a component of the transistor.

The transistor in FIG. 13B may also include a backgate electrode that overlaps the semiconductor film 1614 with the insulating film 1617 placed therebetween.

The channel protective film 1618 can prevent the portion serving as a channel formation region in the semiconductor film 1614 from being damaged in a later step (e.g., from being reduced in thickness by plasma or an etchant in etching). Therefore, the reliability of the transistor can be improved.

Figure 13C:
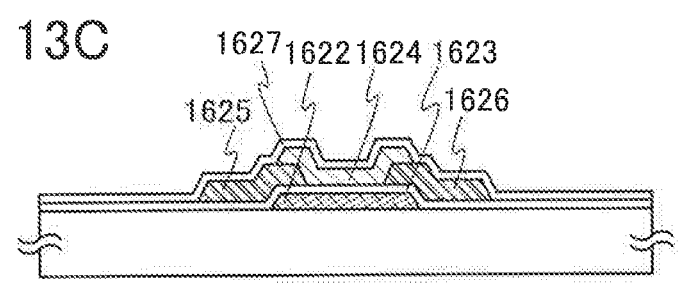

A transistor illustrated in FIG. 13C is a bottom-gate bottom-contact transistor.

The transistor illustrated in FIG. 13C includes a gate electrode 1622 formed on an insulating surface, a gate insulating film 1623 over the gate electrode 1622, conductive films 1625 and 1626 over the gate insulating film 1623, and a semiconductor film 1624 that overlaps the gate electrode 1622 with the gate insulating film 1623 placed therebetween and is formed over the conductive films 1625 and 1626. An insulating film 1627 formed over the conductive films 1625 and 1626 and the semiconductor film 1624 may be considered as a component of the transistor.

The transistor in FIG. 13C may also include a backgate electrode that overlaps the semiconductor film 1624 with the insulating film 1627 placed therebetween.

Figure 13D:
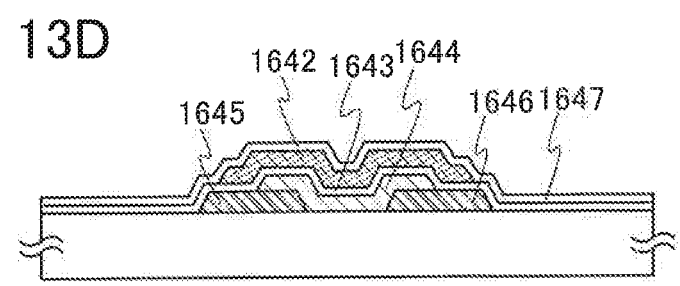

A transistor illustrated in FIG. 13D is a top-gate bottom-contact transistor.

The transistor illustrated in FIG. 13D includes conductive films 1645 and 1646 formed over an insulating surface, a semiconductor film 1644 formed over the insulating surface and the conductive films 1645 and 1646, a gate insulating film 1643 formed over the conductive films 1645 and 1646 and the semiconductor film 1644, and a gate electrode 1642 that overlaps the semiconductor film 1644 with the gate insulating film 1643 placed therebetween. An insulating film 1647 formed over the gate electrode 1642 may be considered as a component of the transistor.

This embodiment can be implemented in combination with any other embodiment as appropriate.

Embodiment 4

Figure 14:
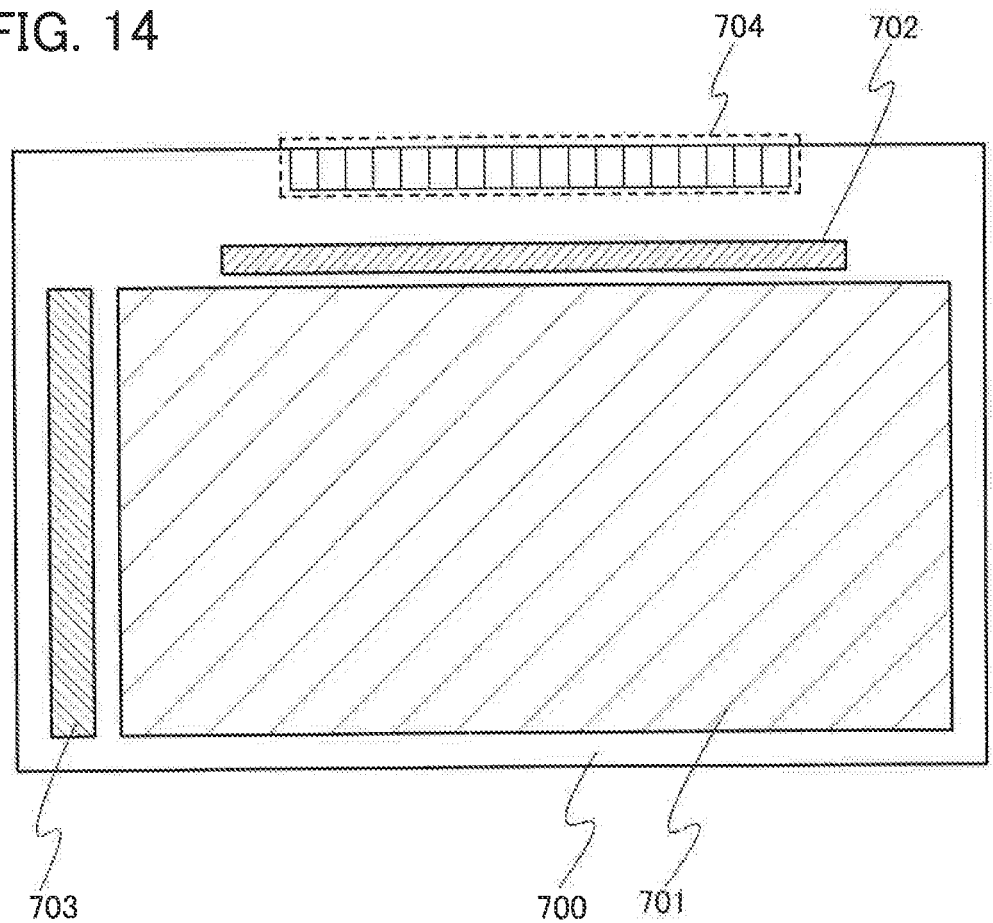
FIG. 14 illustrates a display device according to one embodiment of the present invention.

FIG. 14 illustrates an example of a panel that corresponds to one embodiment of a display device. The panel illustrated in FIG. 14 includes a substrate 700 and a pixel portion 701, a signal line driver circuit 702, a scan line driver circuit 703, and a terminal 704 that are provided over the substrate 700.

The pixel portion 701 includes a plurality of pixels. Each pixel includes a display element and at least one transistor for controlling the operation of the display element. The scan line driver circuit 703 selects a pixel included in the pixel portion 701 by controlling supply of potentials to scan lines connected to the pixels. The signal line driver circuit 702 controls supply of an image signal to the pixel selected by the scan line driver circuit 703.

At least one of the signal line driver circuit 702 and the scan line driver circuit 703 includes the inverter circuit described in Embodiment 1 or the flip-flop circuit or the shift register circuit described in Embodiment 2. With such a structure, the effects described in Embodiment 1 or Embodiment 2 can be achieved, and the size of the pixel portion 701 can be increased. Moreover, a larger number of pixels can be provided in the pixel portion 701.

This embodiment can be implemented in combination with any other embodiment as appropriate.

Embodiment 5

The semiconductor device according to one embodiment of the present invention can be used for electronic devices such as display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device according to one embodiment of the present invention are mobile phones, game consoles including portable game consoles, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multi-function printers, automated teller machines (ATM), and vending machines. FIGS. 15A to 15E illustrate specific examples of these electronic devices.

Figure 15A:
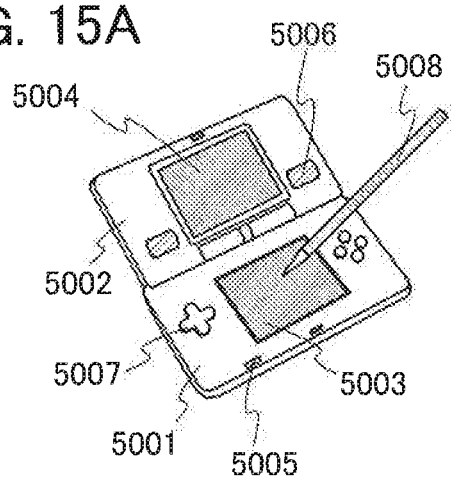
FIGS. 15A to 15E each illustrate an electronic device according to one embodiment of the present invention.

FIG. 15A illustrates a portable game console including a housing 5001, a housing 5002, a display portion 5003, a display portion 5004, a microphone 5005, a speaker 5006, an operation key 5007, a stylus 5008, and the like. By using the semiconductor device according to one embodiment of the present invention in a driver circuit of a portable game console, a low-power portable game console that operates stably can be provided. By using the semiconductor device according to one embodiment of the present invention in the display portion 5003 or the display portion 5004, a portable game console with high image quality can be provided. Note that although the portable game console in FIG. 15A includes the two display portions 5003 and 5004, the number of display portions included in the portable game console is not limited to two.

Figure 15B:
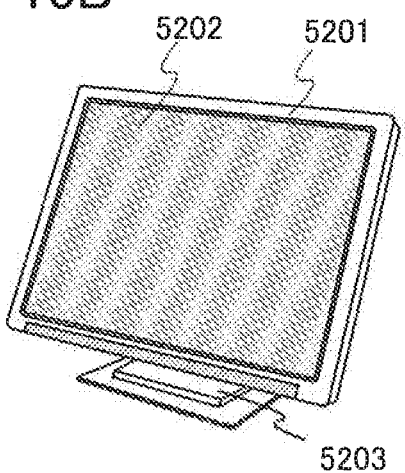

FIG. 15B illustrates a display device including a housing 5201, a display portion 5202, a support base 5203, and the like. By using the semiconductor device according to one embodiment of the present invention in a driver circuit of a display device, a low-power display device that operates stably can be provided. By using the semiconductor device according to one embodiment of the present invention in the display portion 5202, a display device with high image quality can be provided. Note that a display device includes, in its category, any display device for displaying information, such as display devices for personal computers, TV broadcast reception, and advertisement.

Figure 15C:
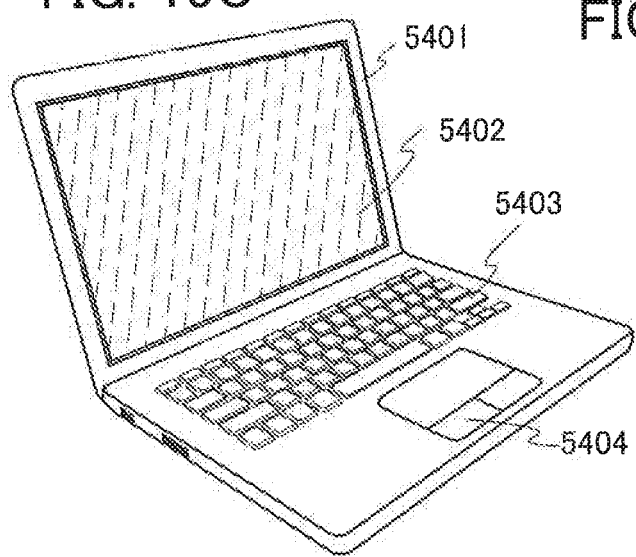

FIG. 15C illustrates a laptop personal computer including a housing 5401, a display portion 5402, a keyboard 5403, a pointing device 5404, and the like. By using the semiconductor device according to one embodiment of the present invention in a driver circuit of a laptop personal computer, a low-power laptop personal computer that operates stably can be provided. By using the semiconductor device according to one embodiment of the present invention in the display portion 5402, a laptop personal computer with high image quality can be provided.

Figure 15D:
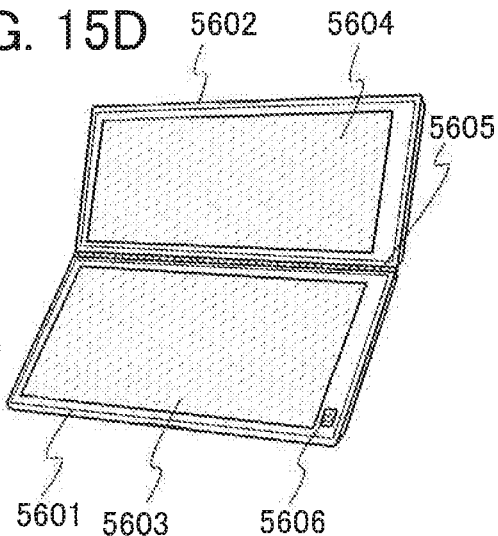

FIG. 15D illustrates a personal digital assistant including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602. A semiconductor display device with a position input function may be used as at least one of the first display portion 5603 and the second display portion 5604. Note that the position input function can be added by providing a touch panel in a semiconductor display device. Alternatively, the position input function can be added by providing a photoelectric conversion element called a photosensor in a pixel portion of a semiconductor display device. By using the semiconductor device according to one embodiment of the present invention in a driver circuit of a personal digital assistant, a low-power personal digital assistant that operates stably can be provided. By using the semiconductor device according to one embodiment of the present invention in the first display portion 5603 or the second display portion 5604, a personal digital assistant with high image quality can be provided.

Figure 15E:
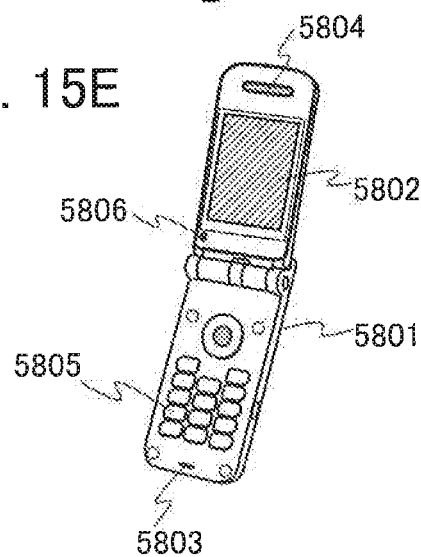

FIG. 15E illustrates a mobile phone including a housing 5801, a display portion 5802, an audio input portion 5803, an audio output portion 5804, operation keys 5805, a light-receiving portion 5806, and the like. Light received in the light-receiving portion 5806 is converted into electrical signals, whereby external images can be loaded. By using the semiconductor device according to one embodiment of the present invention in a driver circuit of a mobile phone, a low-power mobile phone that operates stably can be provided. By using the semiconductor device according to one embodiment of the present invention in the display portion 5802, a mobile phone with high image quality can be provided.

This embodiment can be implemented in combination with any other embodiment as appropriate.

This application is based on Japanese Patent Applications serial No. 2011-217150 filed with Japan Patent Office on Sep. 30, 2011, the entire contents of which are hereby incorporated by reference.

What is claimed is:

1. A semiconductor device comprising:
a first transistor;
a second transistor;
a third transistor; and
a capacitor,
wherein one of a source and a drain of the first transistor is electrically connected to one of a source and a drain of the second transistor,
wherein one of a source and a drain of the third transistor is electrically connected to a gate of the first transistor,
wherein a gate of the second transistor is electrically connected to a gate of the third transistor,
wherein a first electrode of the capacitor is electrically connected to the one of the source and the drain of the first transistor, and
wherein a second electrode of the capacitor is electrically connected to the gate of the second transistor.

2. The semiconductor device according to claim 1,
wherein the first transistor, the second transistor and the third transistor have the same conductivity type.

3. The semiconductor device according to claim 1,
wherein each of the first transistor, the second transistor and the third transistor comprises an oxide semiconductor in a channel formation region.

4. A semiconductor device comprising:
a first transistor;
a second transistor;
a third transistor; and
a capacitor,
wherein one of a source and a drain of the first transistor is electrically connected to one of a source and a drain of the second transistor,
wherein one of a source and a drain of the third transistor is electrically connected to a gate of the first transistor,
wherein a gate of the second transistor is electrically connected to a gate of the third transistor,
wherein a first electrode of the capacitor is electrically connected to the one of the source and the drain of the first transistor,
wherein a second electrode of the capacitor is electrically connected to the gate of the second transistor, and
wherein the other of the source and the drain of the second transistor is electrically connected to the other of the source and the drain of the third transistor.

5. The semiconductor device according to claim 4,
wherein the first transistor, the second transistor and the third transistor have the same conductivity type.

6. The semiconductor device according to claim 4,
wherein each of the first transistor, the second transistor and the third transistor comprises an oxide semiconductor in a channel formation region.

7. A semiconductor device comprising:
a first transistor;
a second transistor;
a third transistor; and
a capacitor,
wherein one of a source and a drain of the first transistor is electrically connected to one of a source and a drain of the second transistor,
wherein one of a source and a drain of the third transistor is electrically connected to a gate of the first transistor,
wherein a gate of the second transistor is electrically connected to a gate of the third transistor,
wherein a first electrode of the capacitor is electrically connected to the one of the source and the drain of the first transistor,
wherein a second electrode of the capacitor is electrically connected to the gate of the second transistor,
wherein the other of the source and the drain of the second transistor is electrically connected to the other of the source and the drain of the third transistor,
wherein a first potential is supplied to the other of the source and the drain of the first transistor,
wherein a second potential is supplied to the other of the source and the drain of the second transistor, and
wherein a signal is supplied to the second electrode of the capacitor.

8. The semiconductor device according to claim 7,
wherein the signal oscillates between a first state and a second state.

9. The semiconductor device according to claim 7,
wherein the first transistor, the second transistor and the third transistor have the same conductivity type.

10. The semiconductor device according to claim 7,
wherein each of the first transistor, the second transistor and the third transistor comprises an oxide semiconductor in a channel formation region.

* * * * *